United States Patent
Suda et al.

[11] Patent Number: 6,053,980
[45] Date of Patent: Apr. 25, 2000

[54] SUBSTRATE PROCESSING APPARATUS

[75] Inventors: Atsuhiko Suda; Kazuyuki Toyoda; Issei Makiguchi; Makoto Ozawa, all of Tokyo, Japan

[73] Assignee: Kokusai Electric Co., Ltd., Tokyo, Japan

[21] Appl. No.: 08/923,110

[22] Filed: Sep. 4, 1997

[30] Foreign Application Priority Data

Sep. 26, 1996 [JP] Japan .................................... 8-275581

[51] Int. Cl.[7] .......................... B25J 21/00; H01L 21/302; H01L 21/205
[52] U.S. Cl. .................. 118/719; 414/744.5; 414/744.6; 414/935; 414/937; 414/939; 414/941; 414/217; 901/14; 901/15; 156/345
[58] Field of Search .............................. 414/744.5, 744.6, 414/935, 937, 939, 941, 217; 901/14, 15; 118/719; 156/345

[56] References Cited

U.S. PATENT DOCUMENTS

| | | | |
|---|---|---|---|
| 4,816,638 | 3/1989 | Ukai et al. | 219/121.43 |
| 5,083,896 | 1/1992 | Uehara et al. | 414/744.5 |
| 5,151,008 | 9/1992 | Ishida et al. | 414/744.5 |
| 5,584,647 | 12/1996 | Uehara et al. | 414/744.5 |
| 5,695,564 | 12/1997 | Imahashi | 118/719 |
| 5,713,717 | 2/1998 | Cho | 414/744.5 |
| 5,766,360 | 6/1998 | Sato et al. | 118/719 |

FOREIGN PATENT DOCUMENTS

| | | |
|---|---|---|
| 2 638 386 | 5/1990 | France . |
| 44 12 915 A1 | 11/1994 | Germany . |
| 59-072739 | 4/1984 | Japan . |
| 60-10625 | 1/1985 | Japan . |
| 61-124135 | 6/1986 | Japan . |
| 2152251 | 6/1990 | Japan . |
| 3293231 | 12/1991 | Japan . |
| 4-240721 | 8/1992 | Japan . |
| 5152215 | 6/1993 | Japan . |
| 07086169A | 3/1995 | Japan . |
| 7-221163 | 8/1995 | Japan . |
| WO 97/10079 | 3/1997 | WIPO . |
| WO 97/15423 | 5/1997 | WIPO . |
| WO 97/26117 | 7/1997 | WIPO . |

Primary Examiner—Thi Dang

[57] ABSTRACT

A substrate processing apparatus comprises a substrate transfer section, connection modules attached to the substrate transfer section, and a first substrate transfer robot in the substrate transfer section capable of transferring substrates to the connection modules. The connection module comprises a substrate processing chamber, first and second intermediate chambers between the substrate processing chamber and the substrate transfer section. The second intermediate chamber is provided with a first substrate holder, the substrate processing chamber is provided with a second substrate holder, and the first intermediate chamber is provided with a substrate transfer device capable of mounting a plurality of the substrates held being stacked in the vertical direction by the first substrate holder, onto the second substrate holder such that the substrates are arranged side by side in the horizontal direction.

67 Claims, 13 Drawing Sheets

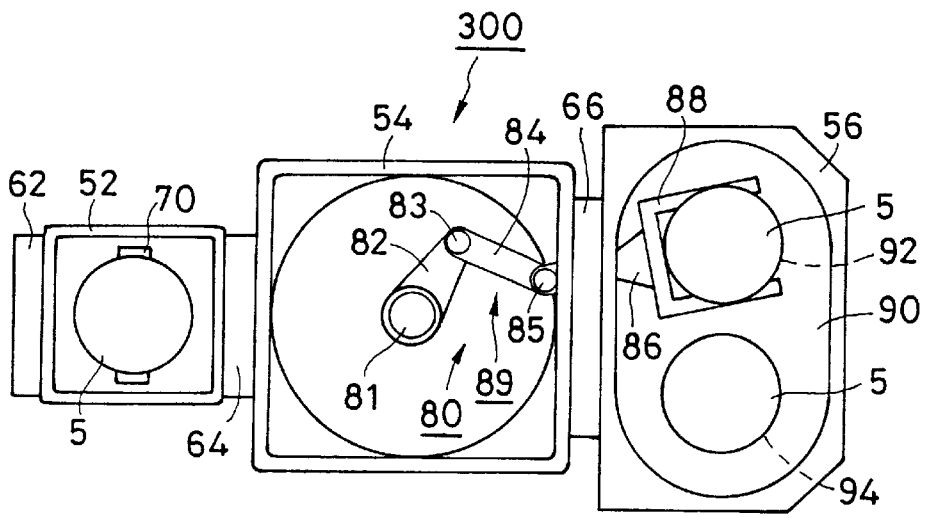
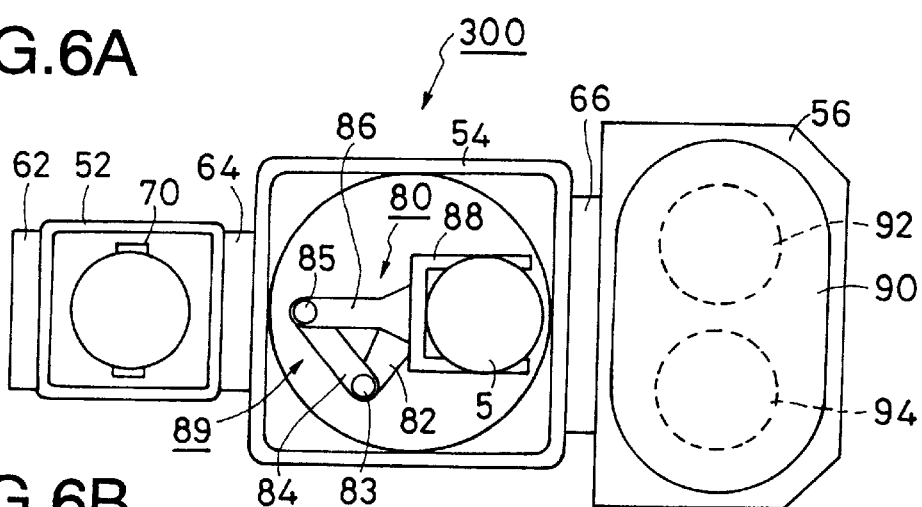
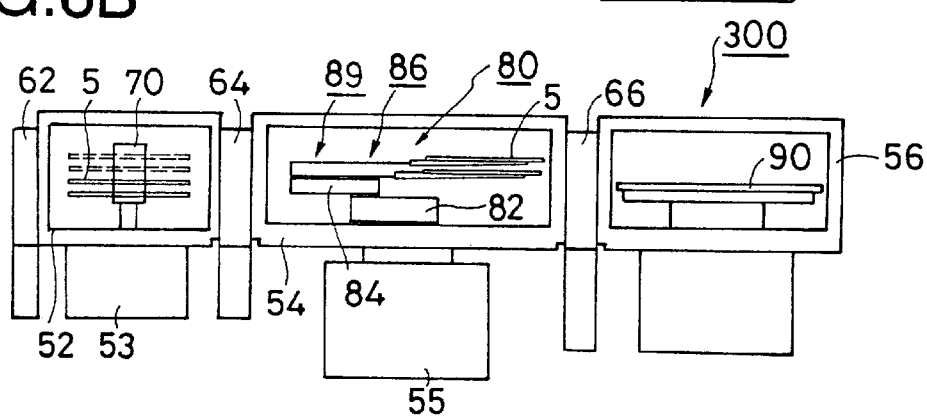

SUBSTRATE PROCESSING APPARATUS

BACKGROUND OF THE INVENTION

1. Field of the Invention

The present invention relates to a substrate processing apparatus, a substrate transfer device and a substrate transfer apparatus, particularly, to a semiconductor wafer processing apparatus, and more particularly, to a semiconductor wafer processing apparatus for processing a semiconductor wafer utilizing plasma such as a plasma etching apparatus, a plasma CVD (Chemical Vapor Deposition) apparatus and a plasma ashing apparatus, and to a substrate transfer device and a substrate transfer apparatus which can suitably be used for such a semiconductor wafer processing apparatus.

2. Description of the Related Art

FIG. 17 is a plan view showing an example of a plasma CVD apparatus 500 among conventional semiconductor wafer processing apparatuses using plasma.

Units, i.e., reaction chambers 552, 554, 556 and a cassette chamber 520 are provided around a load lock chamber 510 having a transfer robot 570 therein through gate valves 562, 564, 566 and 542, respectively. Each of the units is formed into a hermetic structure. The cassette chamber 520 is provided, apart from the gate valve 542, with an outer gate valve 544 for taking a cassette 530 in and out.

In the plasma CVD apparatus 500 having the above described structure, semiconductor wafers 5 are transferred between the cassette chamber 520 and the reaction processing chambers 552, 554, and 556 only by the transfer robot 570 of the load lock chamber 510. Therefore, it is difficult to enhance the processing efficiency of the semiconductor wafers 5. In order to increase the throughput, it is necessary to increase the number of corners or angles of the load lock chamber 510, that is to increase the number of sides of the load lock chamber 510, so as to increase the number of the reaction processing chambers 552, 554, and 556. However, with this method, substrate transfer by the transfer robot 570 more and more determines the entire processing speed of the substrate and thus, it is still difficult to enhance the processing efficiency of the semiconductor wafer 5.

SUMMARY OF THE INVENTION

It is, therefore, an object of the present invention to provide a substrate processing apparatus which can exhibit a high processing efficiency of the substrate and a high throughput.

It is another object of the present invention to provide a substrate processing apparatus which is suitable for plasma processing.

According to a first aspect of the present invention, there is provided a first substrate processing apparatus, comprising:

a substrate transfer section;

a module attached to the substrate transfer section; and first substrate transfer means disposed in the substrate transfer section and capable of transferring a substrate or substrates to the module, wherein the module comprises:

a substrate processing chamber, having a hermetic structure, for processing the substrate or the substrates;

first and second intermediate chambers provided between the substrate processing chamber and the substrate transfer section, each of the first and second intermediate chambers having a hermetic structure, the first intermediate chamber being located closer to the substrate processing chamber than the second intermediate chamber, and the second intermediate chamber being located closer to the substrate transfer section than the first intermediate chamber;

a first valve provided between the substrate processing chamber and the first intermediate chamber, the first valve being capable of establishing hermetic isolation between the substrate processing chamber and the first intermediate chamber when the first valve is closed and being capable of allowing the substrate or the substrates to pass through the first valve when the first valve is opened;

a second valve provided between the first and second intermediate chambers, the second valve being capable of establishing hermetic isolation between the first and second intermediate chambers when the second valve is closed and being capable of allowing the substrate or the substrates to pass through the second valve when the second valve is opened; and a third valve provided between the second intermediate chamber and the substrate transfer section, the third valve being capable of establishing hermetic isolation between the second intermediate chamber and the substrate transfer section when the third valve is closed and being capable of allowing the substrate or the substrates to pass through the third valve when the third valve is opened, wherein the second intermediate chamber is provided with first substrate holding means capable of holding a plurality of the substrates such that the plurality of substrates are stacked in a substantially vertical direction, wherein the substrate processing chamber is provided with second substrate holding means capable of holding a plurality of the substrates such that the plurality of substrates are arranged side by side in a substantially horizontal direction, and wherein the first intermediate chamber is provided with second substrate transfer means capable of mounting a plurality of the substrates held in a substantially vertical direction by the first substrate holding means, onto the second substrate holding means such that the plurality of substrates are arranged side by side in a substantially horizontal direction.

According to a second aspect of the present invention, there is provided a second substrate processing apparatus, comprising:

a substrate transfer section;

a plurality of modules attached to the substrate transfer section; and first substrate transfer means disposed in the substrate transfer section and capable of transferring a substrate or substrates to the plurality of modules, wherein each of the plurality of modules comprises:

a substrate processing chamber, having a hermetic structure, for processing the substrate or the substrates;

first and second intermediate chambers provided between the substrate processing chamber and the substrate transfer section, each of the first and second intermediate chambers having a hermetic structure, the first intermediate chamber being located closer to the substrate processing chamber than the second intermediate chamber, and the second intermediate chamber being located closer to the substrate transfer section than the first intermediate chamber;

a first valve provided between the substrate processing chamber and the first intermediate chamber, the first valve being capable of establishing hermetic isolation between the substrate processing chamber and the first intermediate chamber when the first valve is closed and being capable of allowing the substrate or the substrates to pass through the first valve when the first valve is opened;

a second valve provided between the first and second intermediate chambers, the second valve being capable of establishing hermetic isolation between the first and second intermediate chambers when the second valve is closed and being capable of allowing the substrate or the substrates to pass through the second valve when the second valve is opened; and a third valve provided between the second intermediate chamber and the substrate transfer section, the third valve being capable of establishing hermetic isolation between the second intermediate chamber and the substrate transfer section when the third valve is closed and being capable of allowing the substrate or the substrates to pass through the third valve when the third valve is opened, wherein the second intermediate chamber is provided with a first substrate holding means capable of holding a plurality of the substrates such that the plurality of substrates are stacked in a substantially vertical direction, wherein the substrate processing chamber is provided with second substrate holding means capable of holding a plurality of the substrates such that the plurality of substrates are arranged side by side in a substantially horizontal direction, and wherein the first intermediate chamber is provided with a second substrate transfer means capable of mounting the plurality of substrates held in a substantially vertical direction by the first substrate holding means, onto the second substrate holding means such that the plurality of substrates are arranged side by side in a substantially horizontal direction.

According to a third aspect of the present invention, there is provided a substrate transfer device capable of transferring a plurality of substrates between first substrate holding means capable of holding a plurality of the substrates such that the plurality of substrates are stacked in a substantially vertical direction and a second substrate holding means capable of holding a plurality of the substrates such that the plurality of substrates are arranged side by side in a substantially horizontal direction, wherein the substrate transfer device includes a plurality of substrate mounting means capable of mounting the substrates, each of the plurality of substrate mounting means includes a substrate mounting section for mounting the substrate, in a state where the substrate mounting sections are stacked in a substantially vertical direction, a plurality of substrates stacked in a substantially vertical direction can substantially simultaneously be received from the first substrate holding means by the plurality of substrate mounting means and/or a plurality of the substrates can substantially simultaneously be mounted on the first substrate holding means by the plurality of substrate mounting means such that the plurality of substrates are stacked in a substantially vertical direction; and in a state where the substrate mounting sections are arranged side by side in a substantially horizontal direction, a plurality of the substrates can substantially simultaneously be received from the second substrate holding means by the plurality of substrate mounting means and/or a plurality of the substrates can substantially simultaneously be mounted on the second substrate holding means in a state where the plurality of substrates are arranged side by side in a substantially horizontal direction by the plurality of substrate mounting means.

BRIEF DESCRIPTION OF THE DRAWINGS

The above and further objects, features and advantages of the present invention will become more apparent from the following detailed description taken in conjunction with the accompanying drawings, wherein:

FIG. 5 is a schematic transverse sectional view for explaining a connection module used in the one embodiment of the present invention;

FIGS. 6A and 6B are a schematic transverse sectional view and a schematic longitudinal sectional view, respectively, for explaining the connection module used in the one embodiment of the present invention;

DESCRIPTION OF THE PREFERRED EMBODIMENTS

Figure 1A:
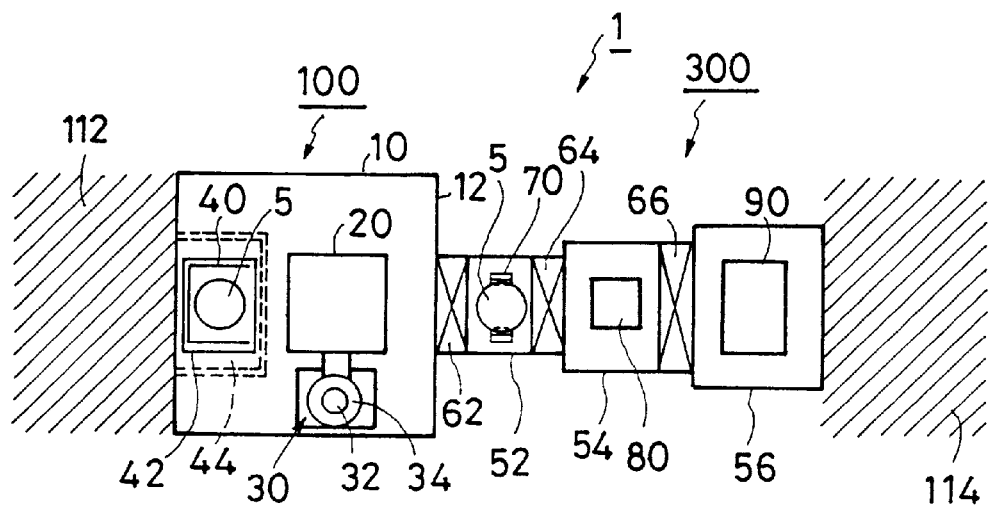
FIGS. 1A and 1B are a plan view and a sectional view, respectively, for explaining a semiconductor wafer processing apparatus according to one embodiment of the present invention.

Next, one embodiment of the present invention will be explained referring to the drawings.

A semiconductor wafer processing apparatus 1 according to the present embodiment will be explained by taking the case of a plasma CVD apparatus.

Figure 1B:
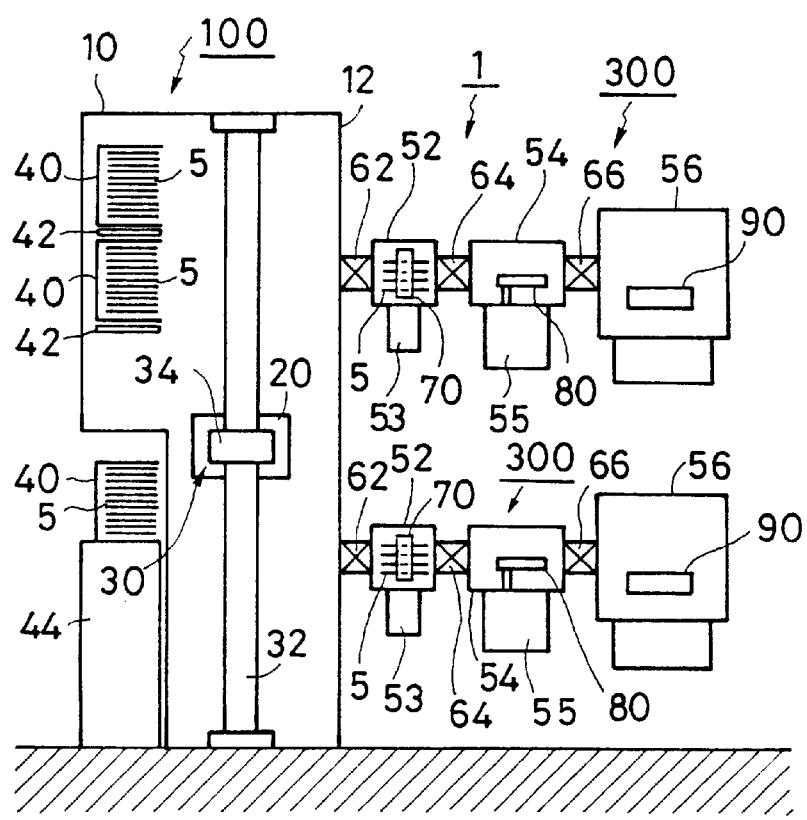

First, referring to FIGS. 1A and 1B, the semiconductor wafer processing apparatus 1 includes a cassette loader unit 100 and two connection modules 300.

The cassette loader unit 100 includes a cassette loader chamber 10 having a chamber wall 12 to which the two connection modules 300 are detachably attached. The two connection modules 300 are piled up at a distance in a vertical direction.

Because the plurality of connection modules 300 are piled up in a vertical direction in this manner, even though the processing efficiency of the wafers 5 is enhanced by using the plurality of connection modules 300, the space of a clean room occupied by the semiconductor wafer processing apparatus 1 is not increased.

Further, as maintenance areas, the semiconductor wafer processing apparatus 1 only has a maintenance area 112 at the side of the cassette loader unit 100 and a maintenance area 114 at the side of a reaction processing chamber 56. Therefore, even though the processing efficiency of the wafers 5 is enhanced by using the plurality of connection modules 300, maintenance areas of the semiconductor wafer processing apparatus 1 is not increased.

Further, because the plurality of connection modules 300 piled up in a vertical direction are separated from one another and each of the plurality of connection modules 300 is detachably attached to the chamber wall 12 of the cassette loader chamber 10, when any one of the connection modules 300 requires maintenance, only the connection module 300 that requires the maintenance can easily be detached. Furthermore, even when the maintenance is carried out for such a connection module 300, other connection modules 300 can be operated. As a result, a net working rate of the semiconductor wafer processing apparatus 1 is remarkably enhanced.

Figure 2:
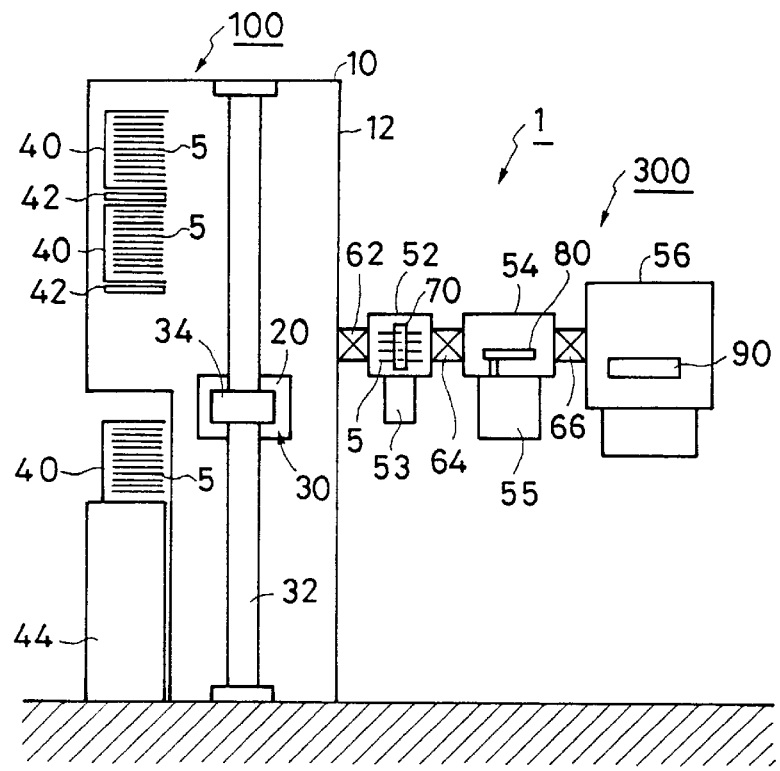
FIG. 2 is a sectional view for explaining the semiconductor wafer processing apparatus in the one embodiment of the present invention.
Figure 3:
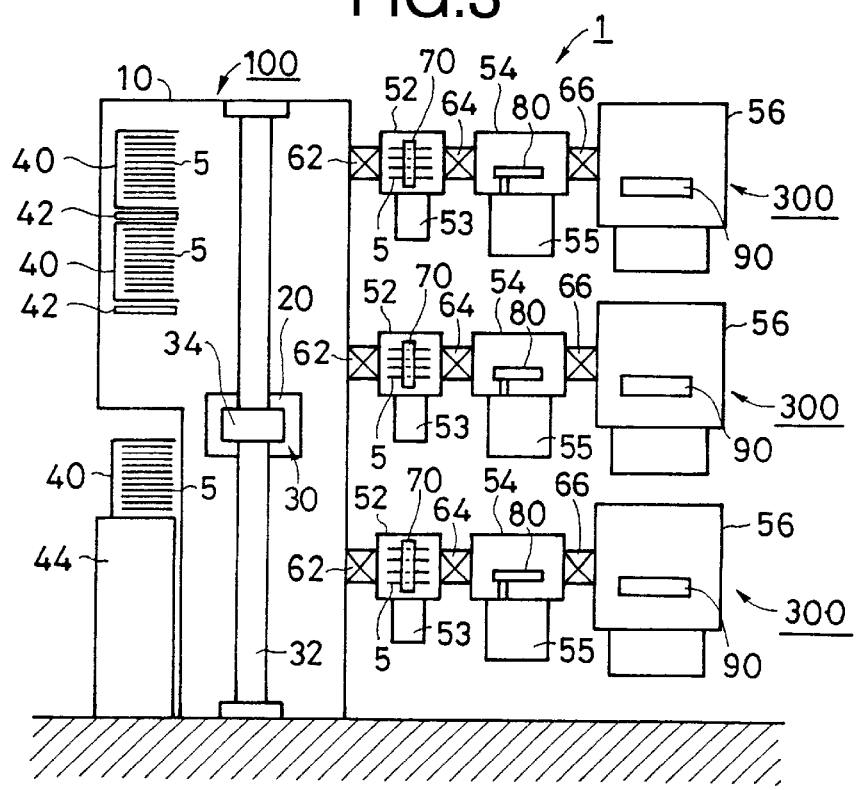
FIG. 3 is a sectional view for explaining the semiconductor wafer processing apparatus according to the one embodiment of the present invention.

Furthermore, because the plurality of connection modules 300 are separated from one another and each of the plurality of the connection modules 300 is detachably attached to the wall 12 of the cassette loader chamber 10, the number of the modules to be attached to the chamber wall 12 of the cassette loader chamber 10 can be appropriately selected in accordance with the number of semiconductor wafers which are required to be processed per hour and a kind of such processings. For example, the substrate processing apparatus may assume a single-stage module structure as shown in FIG. 2, or a three-stage module structure as shown in FIG. 3.

In each of the connection modules 300, an outer gate valve 62, a load lock chamber 52, a gate valve 64, a transfer chamber 54, a gate valve 66 and a reaction processing chamber 56 are coupled and disposed in this order from the side of the cassette loader chamber 10.

The load lock chamber 52, the transfer chamber 54 and the reaction processing chamber 56 respectively have a hermetic structure of vacuum level, and these chambers can be independently brought into a predetermined vacuum atmosphere.

The susceptor 90 is provided in the reaction processing chamber 56. Plasma enhanced CVD is conducted in the reaction processing chamber 56. The susceptor 90 has a structure to hold two semiconductor wafers 5 laterally side by side as shown in FIG. 5.

When the two semiconductor wafers 5 are held laterally side by side in this manner, it is possible to substantially equalize distances between the two wafers 5 and an electrode of the plasma processing apparatus and as a result, densities of the plasma to which the two wafers 5 are exposed become uniform between the substrates and therefore, the plasma processings of the wafers 5 can be conducted uniformly between the wafers 5.

Because the two wafers 5 are simultaneously processed in the reaction processing chamber 56, the processing efficiency is enhanced. The number of wafers 5 to be processed simultaneously can be appropriately selected depending on a size of the wafer 5 or type of processing. For example, it is possible to dispose three wafers 5 laterally side by side to process the three wafers 5 simultaneously. Of course, four or more wafers 5 can be processed simultaneously.

The wafer transfer robot 80 and a driving device 55 for driving the wafer transfer robot 80 are provided in the transfer chamber 54. The wafer transfer robot 80 can transfer the wafers 5 between a wafer boat 70 and the susceptor 90.

Because each of the connection modules 300 is provided with the wafer transfer robot 80 which can transfer the wafers 5 between the wafer boat 70 and the susceptor 90 as described above, it is possible to transfer the wafers 5 from and into the reaction processing chamber 56 irrespective of the processing state in the reaction processing chamber 56 of the other connection module 300. Because each of the connection modules 300 is provided with the reaction processing chamber 56 and the wafer transfer robot 80 in this manner, it is possible to carry out the wafers 5 irrespective of the processing state in the other reaction processing chambers 56 and as a result, it is possible to constantly keep a time period in which the wafers 5 are heated in each of the connection modules 300.

The load lock chamber 52 is provided therein with the wafer boat 70 and a lift 53 for moving the wafer boat 70 up and down. The wafer boat 70 is provided with four slots as shown in FIG. 6B. The upper two of the four slots are for wafers before reaction processing, and the remaining lower two slots are for wafers after reaction processing. In this manner, positions of the slots corresponding to the transfer directions are allocated to the wafer boat 70. The wafer boat 70 can hold twice as many wafers to be processed simultaneously in the reaction processing chamber 56. FIGS. 6A and 6B show a state in which two wafers 5 after reaction processing are held in the lower two slots, and two wafers 5 before reaction processing are being transferred from the upper two slots to the susceptor 90 by the wafer transfer robot 80.

In this manner, the wafer boat 70 provided in the load lock chamber 52 can hold twice as many wafers 5 to be processed simultaneously in the reaction processing chamber 56. Therefore, while wafers 5 are processed in the reaction processing chamber 56, it is possible to hold wafers 5 which should be processed next in the upper two slots of the wafer boat 70 of the load lock chamber 52 beforehand, and after the wafers 5 which have been processed are taken out from the reaction processing chamber 56 into the lower two slots of the wafer boat 70, wafers 5 which are to be processed next can immediately be supplied to the reaction processing chamber 56. As a result, it is possible to process the wafers 5 efficiently to enhance the throughput.

The wafer transfer robot 80 can transfer two wafers 5 between the wafer boat 70 and the susceptor 90 simultaneously. Therefore, it is possible to transfer wafers 5 of the same number of the wafers 5 to be simultaneously processed in the reaction processing chamber. Because the wafer transfer robot 80 can transfer a plurality of wafers 5 simultaneously, and can transfer wafers 5 of the same number of the wafers 5 to be simultaneously processed in the reaction processing chamber, the transferring efficiency of the wafers 5 is enhanced, and the throughput is also enhanced.

Because the load lock chamber 52 is provided with the lift 53 for moving the wafer boat 70 up and down, it is possible to transfer a wafer 5 to a predetermined slot of the wafer boat 70 and as a result, the structure of the wafer transfer robot 80 is simplified and thus, the substrate processing apparatus can be manufactured at a low price.

Further, because the load lock chamber 52 is provided therein with the wafer boat 70, and the transfer chamber 54 is provided therein the wafer transfer robot 80, a holding function and a transferring function of the wafers 5 can be separated. Therefore, for example, while the wafer boat 70 holds wafers 5 for cooling the same, it is possible to transfer other wafers 5 to the reaction processing chamber 56 by the wafer transfer robot 80. Therefore, it is possible to process the wafers 5 more efficiently.

The wafer boat 70 is a heat-resistant boat and thus, a high-temperature wafer 5 which has been processed in the reaction processing chamber 56 can be held by the wafer boat 70 and cooled.

The wafer boat 70 is preferably made of quartz, glass, ceramics or metal. When the wafer boat 70 is made of such material, impurities such as outgas are not generated from the wafer boat 70 even in a vacuum atmosphere and therefore, it is possible to keep the atmosphere clean. As ceramics, a sintered SiC, a sintered SiC on which $SiO_2$ film and so forth is CVD coated, an alumina and the like are preferably used.

Referring again to FIGS. 1A and 1B, the cassette loader chamber 10 is provided therein with a plurality of cassette shelves 42 for holding cassettes and thus, it is possible to hold a plurality of cassettes 40. A cassette loader 44 is disposed outside the cassette loader chamber 10 and at a lower position thereof. The cassette loader 44 includes a mechanism capable of transferring the cassette 40 between the semiconductor wafer processing apparatus 1 and the outside. The cassette 40 is introduced, by the cassette loader 44, into a predetermined introduction port (not shown) provided in the cassette loader chamber 10. The cassette loader 44 can be provided therein with a mechanism for aligning an orientation flat of the wafers 5 accommodated in the cassette 40.

The cassette loader chamber 10 is also provided therein with a cassette transferring-cum-wafer transferring robot 20 and an elevator 30 for lifting and lowering the cassette transferring-cum-wafer transferring robot 20. The elevator 30 includes a screw shaft 32 and an elevating portion 34. A nut (not shown) in the elevating portion 34 and the screw shaft 32 constitute a ball screw. When the screw shaft 32 is rotated, the elevating portion 34 is vertically moved, and in accordance with such movement, the cassette transferring-cum-wafer transferring robot 20 attached to the elevating portion 34 is vertically moved so that the cassette introduction port and the two connection modules 300 can be accessed by the robot 20. As will be described later with reference to FIG. 4, the cassette transferring-cum-wafer transferring robot 20 includes a cassette transfer device 21 and a wafer transfer device 23.

As described above, the cassette loader chamber 10 is provided therein with the cassette transferring-cum-wafer transferring robot 20 to allow the wafers 5 to be transferred to the two connection modules 300, and the transfer chamber 54 of the connection module 300 is provided with the wafer transfer robot 80 to allow the wafers 5 to be transferred to the reaction processing chamber 56. Therefore, transfer of the wafers 5 to each of the connection modules 300 and transfer of the wafers 5 within each of the modules 300 can be accomplished independently and as a result, the wafers can be transferred efficiently.

In this manner, the transfer chamber 54 having the hermetic structure of vacuum level is provided with the wafer transfer robot 80, and the cassette loader chamber 10 is provided therein with the cassette transferring-cum-wafer transferring robot 20. Therefore, the wafers 5 can be transferred to each of the modules 300 under atmospheric pressure by the cassette transferring-cum-wafer transferring robot 20 of the cassette loader chamber 10, and the transfer of the wafers 5 under vacuum can be effected by the wafer transfer robot of each of the connection modules 300. Thus, it is unnecessary that all the regions in which mechanisms for transferring the wafers 5 are installed should be made into hermetic structures of vacuum level, and the cassette loader chamber 10 in which the cassette transferring-cum-wafer transferring robot 20 for transferring the substrate to each of the connection modules 300 is disposed can be made into a region in which the wafers 5 are transferred under atmospheric pressure. Therefore, a region having the hermetic structure of vacuum level can be divided in each of the connection modules 300. As a result, it is possible to simplify the structures of the cassette loader chamber 10 and the cassette transferring-cum-wafer transferring robot 20, and they can be manufactured at low prices. Further, volumes of the load lock chamber 52 and the transfer chamber 54 of each of the connection modules 300 can be reduced, and even though the thickness of their walls are made thinner, sufficient strength can be kept. As a result, the entire apparatus can be manufactured at a low price. Furthermore, a vertical movement of the wafer transfer robot 80 provided in the transfer chamber 54 can be suppressed to the required minimum value and thus, the wafer transfer robot 80 can also be manufactured at a low price. Also, in the transfer chamber 54 having the hermetic structure of vacuum level, particles which may possibly be generated from the driving device of the wafer transfer robot 80 can be suppressed to the minimum.

Next, referring to FIGS. 1A, 1B, 5, 6A and 6B, transfer and processing method of the wafers 5 will be explained.

The cassette 40 introduced into the cassette loader chamber 10 by the cassette loader 44 is mounted on the cassette transferring-cum-wafer transferring robot 20, brought upward by the elevator 30 and then, mounted on the cassette shelf 42. Next, the wafers 5 are mounted on the wafer boat 70 of the load lock chamber 52 by the cassette transferring-cum-wafer transferring robot 20. In the present embodiment, two wafers are transferred at a time from the cassette 40 to the upper two slots of the wafer boat 70 by the cassette transferring-cum-wafer transferring robot 20. When the wafers 5 are transferred to the load lock chamber 52 by the cassette transferring-cum-wafer transferring robot 20, the gate valve 64 is closed, and the outer gate valve 62 is opened. After the wafers 5 are mounted on the wafer boat 70 in the load lock chamber 52, the outer gate valve 62 is closed to draw a vacuum in the load lock chamber 52.

After drawing a vacuum, the gate valve 64 is opened. A vacuum has been drawn in the transfer chamber 54 beforehand.

Then, the two wafers 5 are transferred from the wafer boat 70 in the load lock chamber 52 to the susceptor 90 in the reaction processing chamber 56 by the wafer transfer robot 80 in the transfer chamber 54. At that time, the gate valve 66 is opened and a vacuum has been drawn in the reaction processing chamber 56.

After the wafers 5 are transferred to the susceptor 90, the gate valve 66 is closed and the reaction processing chamber 56 is brought into a predetermined atmosphere, and the two wafers 5 mounted on the susceptor 90 of the reaction processing chamber 56 are simultaneously subjected to a film formation processing by plasma enhanced CVD.

While the film formation processing is conducted by the plasma enhanced CVD, other wafers 5 which have not yet been processed are mounted to the upper two slots of the wafer boat 70 in the load lock chamber 52 in the same manner as described above.

After a predetermined film formation is conducted, a vacuum is drawn in the reaction processing chamber 56 and then, the gate valve 66 is opened. The two wafers 5 are moved, under vacuum, to the lower two slots of the wafer boat 70 in the load lock chamber 52 by the wafer transfer robot 80. At that time, because the wafers 5 which have not yet been processed are mounted in the upper two slots of the wafer boat 70, these two wafers 5 are immediately transferred to the susceptor 90 in the reaction processing chamber 56 by the wafer transfer robot 80 in the wafer transfer chamber 54.

By supplying the wafers 5 which have not yet processed to the load lock chamber 52 beforehand, and keeping in the vacuum atmosphere in this manner, it is possible to shorten the transferring time of the non-processed wafers 5.

After that, the gate valve 64 is closed to bring an interior of the load lock chamber 52 into atmospheric pressure using nitrogen or the like, and the wafers 5 are cooled down to a predetermined temperature there.

Then, the outer gate valve 62 is opened, and the wafers 5 are transferred into the cassette 40 by the wafer transfer device 23 of the cassette transferring-cum-wafer transferring robot 20.

When the predetermined number of wafers 5 are transferred into the cassette 40, the cassette 40 is lowered by the cassette transfer device 21 of the cassette transferring-cum-wafer transferring robot 20 and then, is transferred out of the cassette loader chamber 10.

Figure 4:
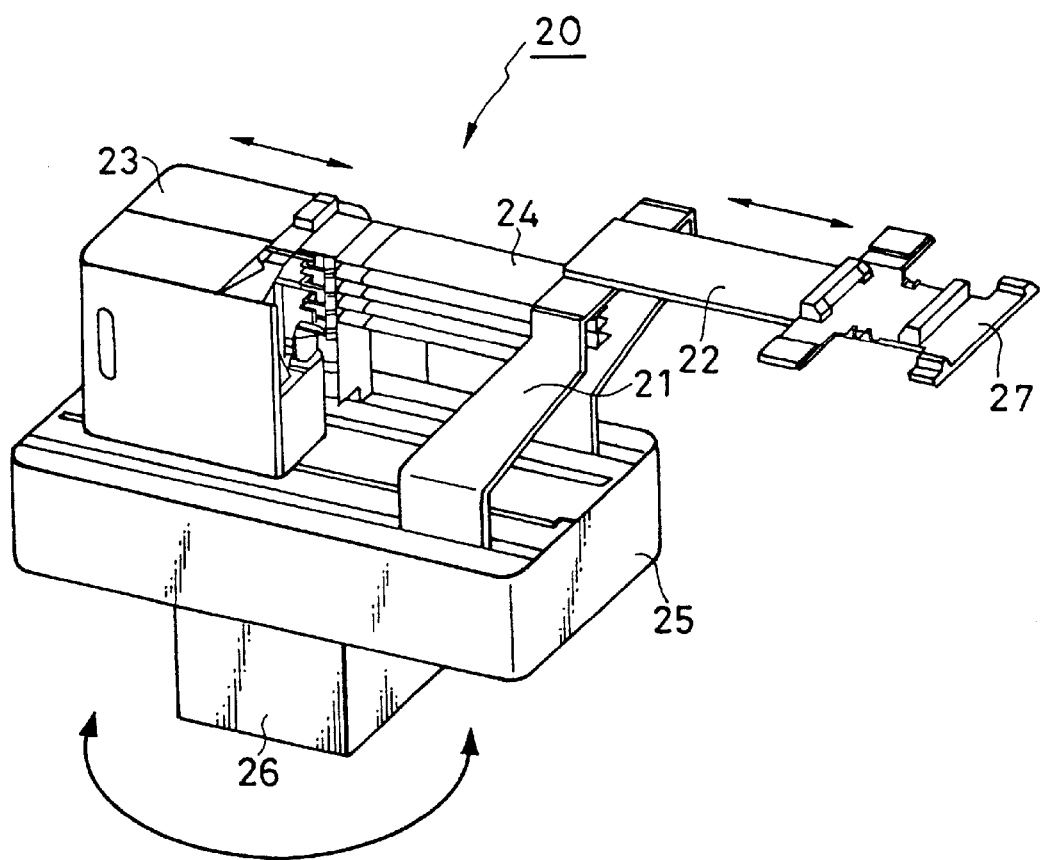
FIG. 4 is s schematic perspective view for explaining a cassette transfer-cum-wafer transfer robot used in the one embodiment of the present invention.

Next, referring to FIG. 4, the cassette transferring-cum-wafer transferring robot 20 used in the present embodiment will be explained.

The cassette transfer device 21 and the wafer transfer device 23 are provided on bases 25 and 26. The cassette transfer device 21 and the wafer transfer device 23 can move independently to each other in parallel in a direction of the arrows. The cassette transfer device 21 includes a cassette transfer arm 22 that is provided at its tip end with a cassette holder 27. The cassette 10 is mounted on the cassette holder 27 and is transferred. The wafer transfer device 23 includes a plurality of tweezers 24. The wafers 5 are mounted on the tweezers 24 and are transferred. By moving a predetermined number of tweezers 24 simultaneously, a predetermined plural number of wafers 5 can be transferred simultaneously.

Next, referring to FIGS. 5 to 16, structures of the wafer transfer robot 80 and the susceptor 90 of the present embodiment, and a wafer transferring method utilizing these will be explained.

Referring to FIGS. 5, 6A and 6B, the transfer chamber 54 is provided therein with the wafer transfer robot 80. The wafer transfer robot 80 is an articulated robot including an arm 89 and a driving section 55 for driving the arm 89. The arm 89 includes auxiliary arms 82, 84 which are moved rotating in a horizontal plane, and a wafer mounting arm 86 located at the forefront thereof. A tip end of the wafer mounting arm 86 is a wafer mounting portion 88 on which the wafer 5 can be mounted. The wafer transfer robot 80 is provided with rotary shafts 81, 83 and 85 respectively allowing the auxiliary arms 82, 84 and the wafer mounting arm 86 to respectively rotate. The rotary shafts 81, 83 and 85 correspond to joints of the articulated arm. Rotation is applied to the rotary shaft 81 by the driving portion 55, and the rotation of the rotary shaft 81 is transmitted to the rotary shafts 83 and 85 by a gear mechanism (not shown). When the rotary shaft 81 is rotated, the arms 82, 84 and 86 are moved horizontally rotating around the rotary shafts 81, 83 and 85, respectively, thereby moving the wafers horizontally.

Figure 15A:
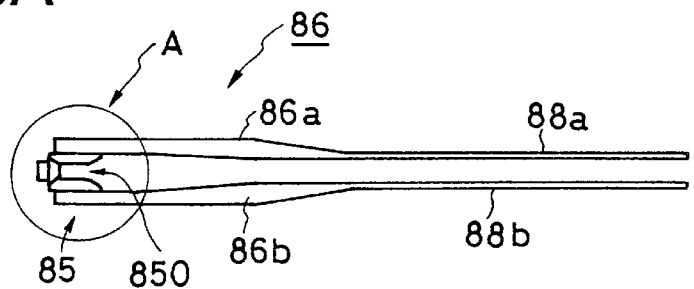
FIG. 15A is a view for explaining a wafer mounting arm of the wafer transfer robot in the connection module according to the one embodiment of the invention.
Figure 15B:
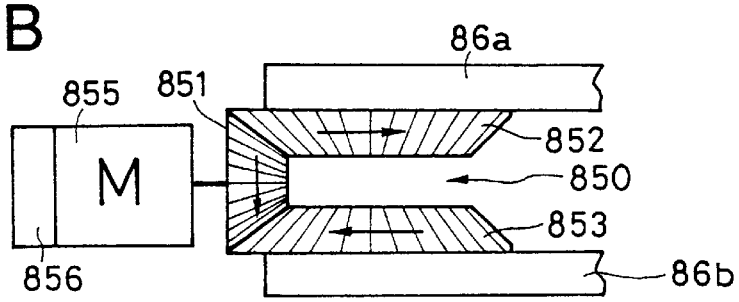
FIG. 15B is an partially enlarged schematic longitudinal sectional view of FIG. 15A.

Referring to FIGS. 6 and 15, two wafer mounting arms 86 (the wafer mounting arms 86a and 86b) are mounted to the rotary shaft 85 such that the two wafer mounting arms 86 are stacked in a vertical direction. Tip ends of the wafer mounting arms 86a and 86b are wafer mounting portions 88a and 88b, respectively, on which wafers 5 can be mounted respectively.

A pitch between the wafer mounting portions 88a and 88b in a vertical direction is the same as a pitch between the wafers 5 held in the wafer boat 70 provided in the transfer chamber 52. Because the wafer mounting arm 86 comprises the two wafer mounting arms 86a and 86b in this manner, it is possible to simultaneously transfer the two wafers 5 by the wafer transfer robot 80 between the wafer boat 70 and the wafer transfer robot 80. During the transfer of the wafers 5, it is unnecessary to vary the pitch between the wafers 5 and therefore, a structure of the wafer transfer robot 80 can be simplified, and a contamination in vacuum can be prevented. Further, because the two wafers 5 can be transferred simultaneously, the efficiency for the wafer transfer is enhanced, and the throughput is also enhanced.

In order to simultaneously transfer the two wafers 5 between the wafer transfer robot 80 and the wafer boat 70 by the wafer transfer robot 80, the wafer mounting arms 86a and 86b are closed around the rotary shaft 85, thereby vertically superposing the wafer mounting portions 88a and 88b which are tip ends of the wafer mounting arms 86a and 86b, respectively, the two wafers 5 respectively mounted on the wafer mounting portions 88a and 88b are simultaneously mounted into the slots of the wafer boat 70, and the wafer mounting portions 88a and 88b which are the tip ends of the wafer mounting arms 86a and 86b, respectively, are superposed in a vertical direction, and the wafers 5 mounted in the slots of the wafer boat 70 are simultaneously received on the wafer mounting portions 88a and 88b. At that time, heights of the slots of the wafer boat 70 are adjusted to heights of the wafer mounting portions 88a and 88b which are tip ends of the wafer mounting arms 86a and 86b, respectively, by moving the wafer boat 70 in a vertical direction by the lift 53 disposed in the load lock chamber 52.

Referring again to FIGS. 15 and 16, in the present embodiment, a bevel gear 850 is employed as the rotary shaft 85. The bevel gear 850 comprises a main shaft 851 and auxiliary shafts 852 and 853. The wafer mounting arms 86a and 86b are mounted to the auxiliary shafts 852 and 853, respectively. When the main shaft 851 is rotated, the auxiliary shafts 852 and 853 are rotated in the respective directions which are opposite to each other in a horizontal direction, thereby rotating around the rotary shaft 85 to open the wafer mounting arms 86a and 86b mounted to the auxiliary shafts 852 and 853, so that the wafer mounting portions 88a and 88b which are respectively the tip ends of the wafer mounting arms 86a and 86b are opened in a horizontal direction. The main shaft 851 is driven by a micro motor 855, and the number of rotations of the main shaft 851 is monitored by an encoder 856.

Figure 7:
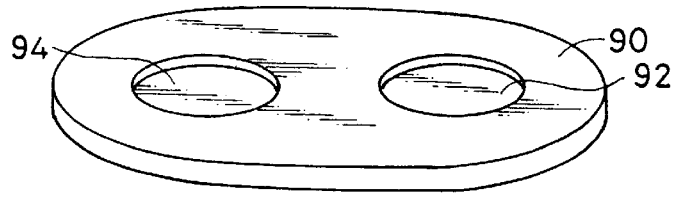
FIG. 7 is a schematic perspective view for explaining a susceptor used in the one embodiment of the present invention.

When the wafer mounting portions 88a and 88b are opened in a horizontal direction in this manner, positions of the wafer mounting portions 88a and 88b after being opened in the horizontal direction respectively correspond to wafer mounting carved portions 92 and 94 of the susceptor 90 as shown in FIGS. 5, 6 and 7. Therefore, by rotating to open the wafer mounting arms 86a and 86b around the rotary shaft 85 so as to open the wafer mounting portions 88a and 88b which are respectively the tip ends of the wafer mounting arms 86a and 86b in the horizontal direction, the two wafers 5 respectively mounted on the wafer mounting portions 88a and 88b can be simultaneously transferred to the wafer mounting curved portions 92 and 94 of the susceptor 90 in a state where the two wafers 5 are arranged side by side in the horizontal direction, and the wafer mounting portions 88a and 88b which are respectively the tip ends of the wafer mounting arms 86a and 86b are opened in the horizontal direction to allow simultaneous receipt, onto the wafer mounting portions 88a and 88b, of the wafers 5 respectively mounted on the wafer mounting curved portions 92 and 94 of the susceptor 90. Because the two wafers 5 can simultaneously be transferred between the susceptor 90 and the wafer transfer robot 80, the efficiency for the wafer transfer is enhanced, and the throughput is also enhanced.

Figure 8A:
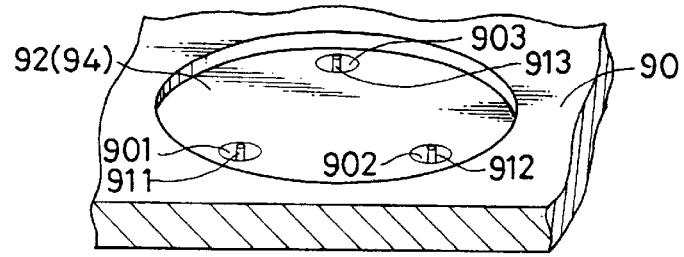
FIGS. 8A and 8B are schematic partially perspective views for explaining one example of a susceptor used in the one embodiment of the invention.
Figure 8B:
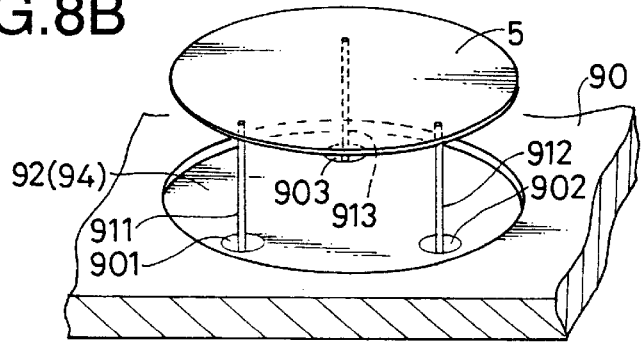
Figure 9A:
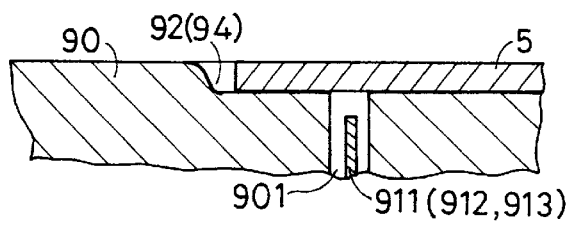
FIGS. 9A and 9B are schematic partially longitudinal sectional views for explaining the one example of the susceptor used in the one embodiment of the invention.
Figure 9B:
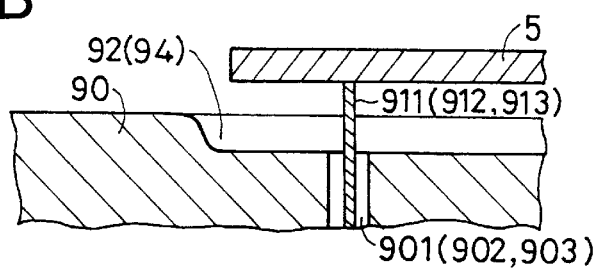

In the present embodiment, as shown in FIGS. 8 and 9, pins 911, 912 and 913 capable of vertically moving the wafer 5 with respect to the susceptor 90, are provided. Each of the wafer mounting curved portions 92 and 94 of the susceptor 90 is provided with through holes 901, 902 and 903 through which the respective pins 911, 912 and 913 can vertically move.

Figure 10A:
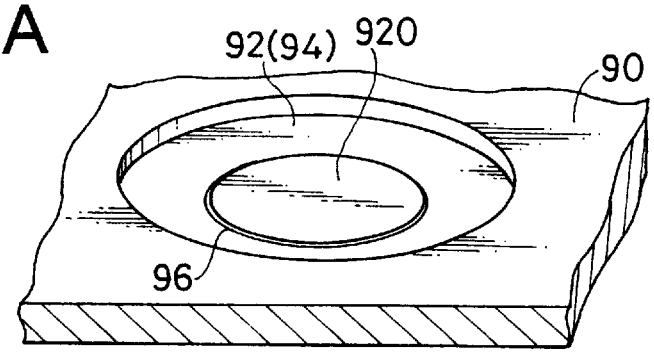
FIGS. 10A and 10B are schematic partially perspective views for explaining another example of the susceptor used in the one embodiment of the present invention.
Figure 10B:
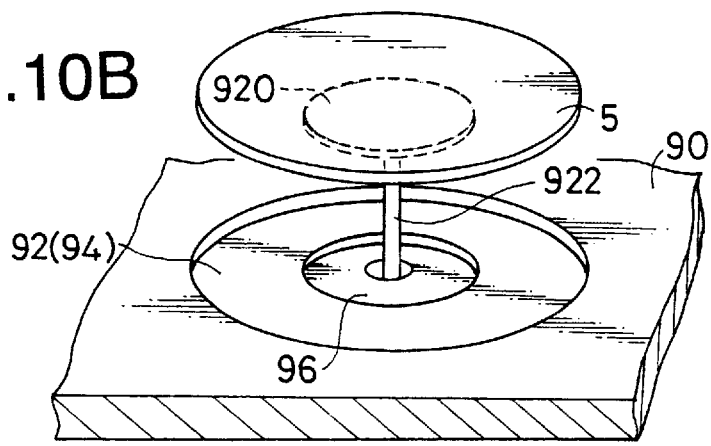
Figure 11A:
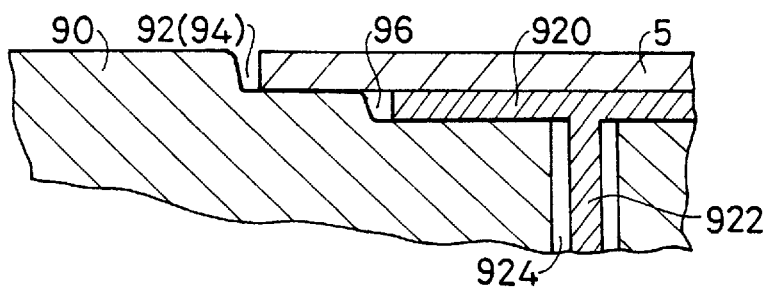
FIGS. 11A and 11B are schematic partially longitudinal sectional views for explaining the another example of the susceptor used in the one embodiment of the present invention.
Figure 11B:
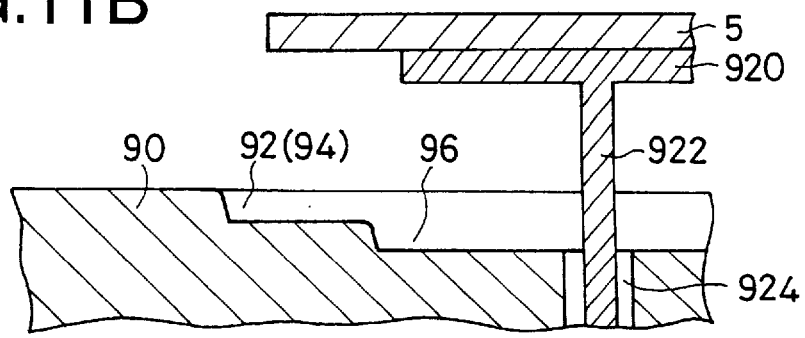

Instead of the pins 911, 912 and 913, as shown in FIGS. 10 and 11, a pedestal 920 capable of vertically moving the wafer 5 with respect to the susceptor 90 may be provided. Each of the wafer mounting curved portions 92 and 94 of the susceptor 90 is provided with a curved portion 96 for a pedestal capable of accommodating the pedestal 920 and a through hole 924 through which a pedestal supporting rod 922 for supporting the pedestal 920 can vertically move.

Because such pins 911, 912, 913 or the pedestal 920 are provided, it is easy to transfer the wafers 5 between the susceptor 90 and the wafer mounting portions 88a and 88b which are the tip ends of the wafer mounting arms 86a and 86b.

That is, the wafer mounting arms 86a and 86b are rotated to open around the rotary shaft 85 so as to open, in the horizontal direction, the wafer mounting portions 88a and 88b which are the tip ends of the wafer mounting arms 86a and 86b, respectively, such that the two wafers 5 respectively mounted on the wafer mounting portions 88a and 88b are respectively positioned above the wafer mounting curved portions 92 and 94 of the susceptor 90. In such a state, the pins 911, 912, 913 or the pedestal 920 are lifted up to mount the wafers 5 from the wafer mounting portions 88a and 88b onto the pins 911, 912, 913 or onto the pedestal 920. Thereafter, the wafer mounting portions 88a and 88b are moved from above the wafer curving portions 92 and 94 of the susceptor 90 and then, the pins 911, 912, 913 or the pedestal 920 are lowered. By the above described operation, the wafers 5 are mounted on the wafer mounting curved portions 92 and 94.

Reversely, the wafers 5 respectively mounted on the wafer mounting curved portions 92 and 94 of the susceptor 90 are mounted on the pins 911, 912, 913 or the pedestal 920 from the susceptor 90 by lifting up the pins 911, 912, 913 or the pedestal 920. Then, the wafer mounting arms 86a and 86b are rotated to open around the rotary shaft 85 so as to open, in the horizontal direction, the wafer mounting portions 88a and 88b which are the tip ends of the wafer mounting arms 86a and 86b, respectively, such that the wafer mounting portions 88a and 88b are respectively positioned above the wafer mounting curved portions 92 and 94 of the susceptor 90. In such a state, the pins 911, 912, 913 or the pedestal 920 are lowered to mount the wafers 5 from the pins 911, 912, 913 or the pedestal 920 onto the wafer mounting portions 88a and 88b.

In the present embodiment, because the bevel gear 850 is used as shown in FIG. 15, when the wafer mounting arms 86a and 86b are rotated to open around the rotary shaft 85, and the wafer mounting portions 88a and 88b which are the respective tip ends of the wafer mounting arms 86a and 86b are opened in a horizontal direction, there is a difference in height between the wafer mounting portions 88a and 88b. In this case, in accordance with the difference in height, by making a degree of up and down movement of the pins 911, 912 and 913 or the pedestal 920 provided corresponding to the wafer mounting curved portion 92 different from a degree of up and down movement of the pins 911, 912 and 913 or the pedestal 920 provided corresponding to the wafer mounting curved portion 94, i.e. by varying a stroke, it becomes easier to transfer the wafers 5 between the wafer mounting curved portions 92, 94 of the susceptor 90 and the wafer mounting portions 88a, 88b which are the tip ends of the wafer mounting arms 86a, 86b, respectively.

It is also possible to mount the wafers 5 on the pins 911, 912, 913 or the pedestal 920, by adding a lifting mechanism to the wafer transfer robot 80.

Figure 16A:
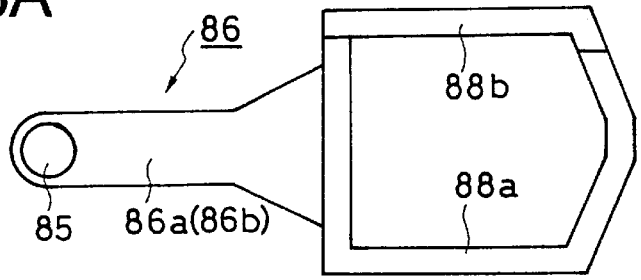
FIGS. 16A and 16B are schematic plan views for explaining the wafer mounting arm of the wafer transfer robot in the connection module according to the one embodiment of the present invention.
Figure 16B:
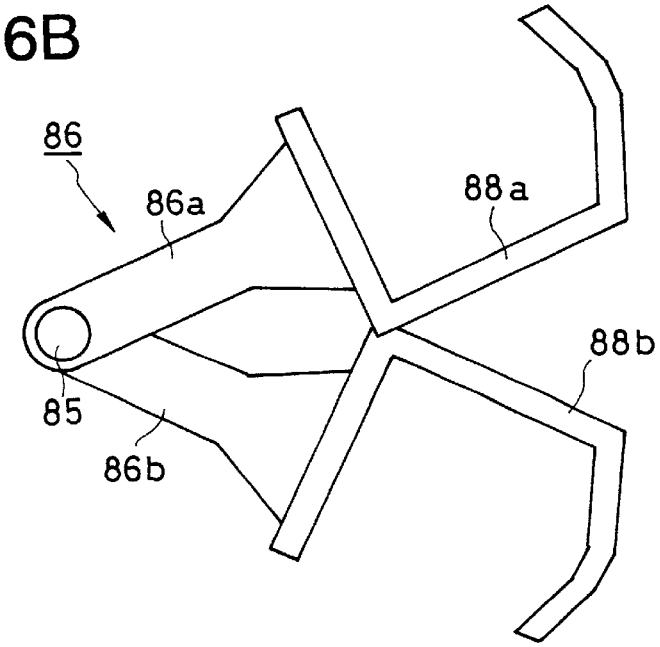

The wafer mounting portions 88a and 88b are provided at their outer sides with opened portions as shown in FIG. 16 so that the wafer mounting portions 88a and 88b can be prevented from hitting against the pins 911, 912, 913 or the pedestal 920.

Next, a method for transferring the wafers 5 between the wafer boat 70 in the load lock chamber 52 and the susceptor 90 in the reaction processing chamber 56, will be explained with reference to FIGS. 12 to 14.

Figure 12A:
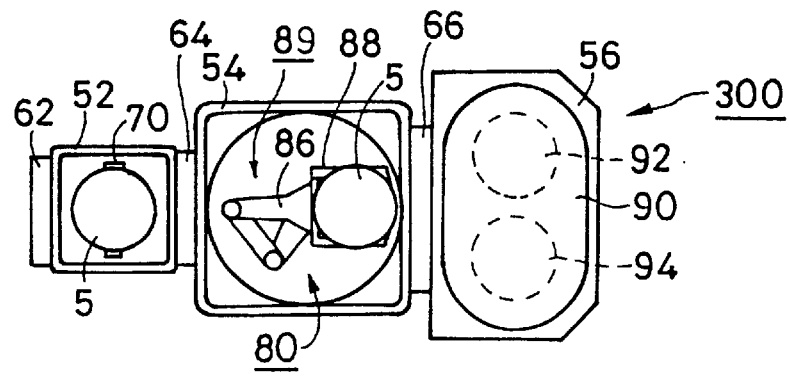
FIGS. 12A to 12E are schematic transverse sectional views for explaining one example of a wafer transfer robot in the connection module of the one embodiment of the present invention and one example of a transfer method.

First, as shown in FIG. 12A, the wafer mounting portions 88a and 88b which are the tip ends of the wafer mounting arms 86a and 86b, respectively, are superposed in a vertical direction by closing the wafer mounting arms 86a and 86b, to simultaneously receive, on the wafer mounting portions 88*a* and 88*b*, the wafers 5 mounted in the slots of the wafer boat 70.

Figure 12B:
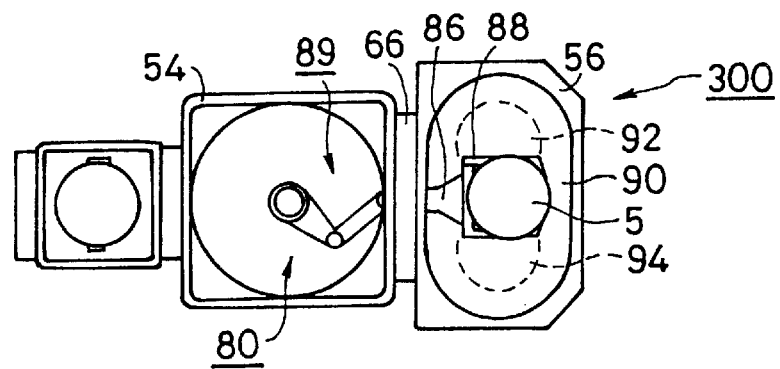

Then, the arm 89 of the wafer transfer robot 80 is extended into the reaction processing chamber 56 as shown in FIG. 12B.

Figure 12C:
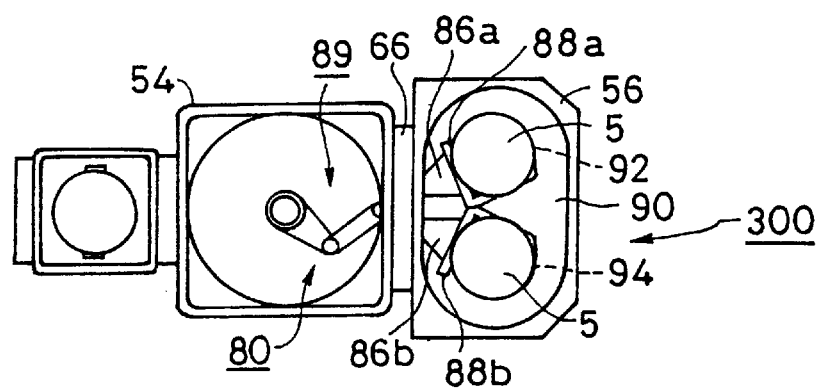

Thereafter, the wafer mounting arms 86*a* and 86*b* of the wafer transfer robot 80 are rotated to open, so as to open, in a horizontal direction, the wafer mounting portions 88*a* and 88*b* which are the respective tip ends of the wafer mounting arms 86*a* and 86*b*, as shown in FIG. 12C. Then, the two wafers 5 are simultaneously mounted on the wafer mounting curved portions 92 and 94, respectively, by the cooperation of the wafer mounting arms 86*a* and 86*b* and the pins 911, 912, 913 (see FIGS. 8 and 9) or by the cooperation of the wafer mounting arms 86*a* and 86*b* and the pedestal 920 (see FIGS. 10 and 11).

Figure 12D:
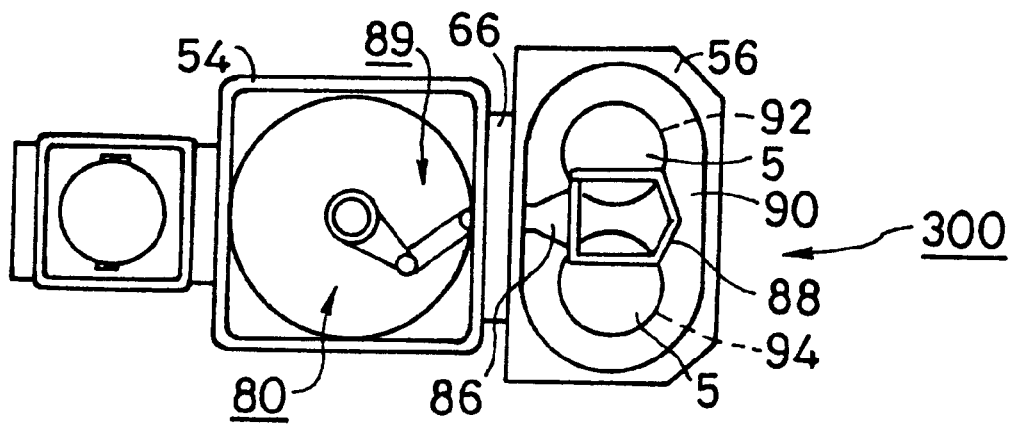

As shown in FIG. 12D, the wafer mounting portions 88*a* and 88*b* which are the respective tip ends of the wafer mounting arms 86*a* and 86*b* are superposed in a vertical direction by closing the wafer mounting arms 86*a* and 86*b*.

Figure 12E:
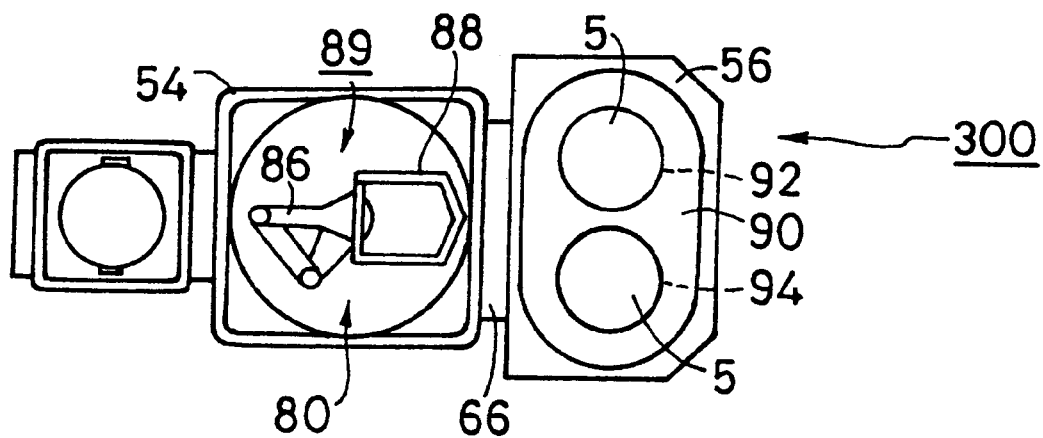

Then, the arm 89 of the wafer transfer robot 80 is accommodated in the transfer chamber 54, as shown in FIG. 12E.

The method for transferring the wafers 5 from the wafer boat 70 in the load lock chamber 52 to the susceptor 90 in the reaction processing chamber 56 has been explained above. The wafers 5 can be transferred from the susceptor 90 to the wafer boat 70 by substantially the opposite procedures and therefore, the explanation of the opposite procedures is omitted here.

As described above, after the arm 89 of the wafer transfer robot 80 is extended into the reaction processing chamber 56, the wafer mounting arms 86*a* and 86*b* of the wafer transfer robot 80 are rotated and opened, to open, in the horizontal direction, the wafer mounting portions 88*a* and 88*b* which are the respective tip ends of the wafer mounting arms 86*a* and 86*b*. Therefore, it is possible to reduce a width of opening of the gate valve 66, and also to simply manufacture the connection module 300 at a low price.

Figure 13A:
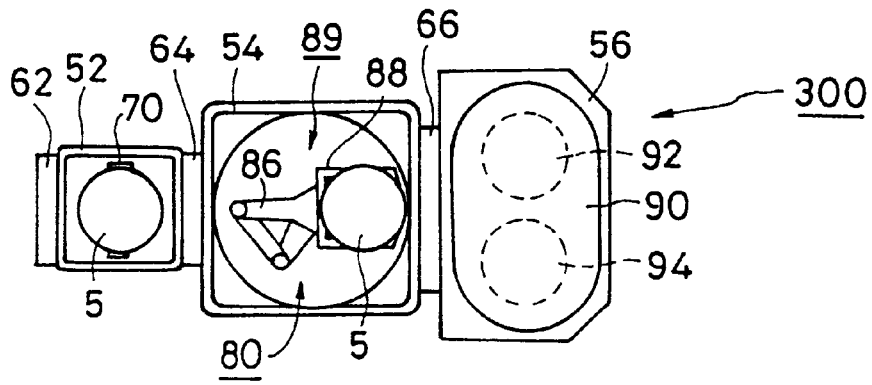
FIGS. 13A to 13C are schematic transverse sectional views for explaining another example of the wafer transfer robot in the connection module of the one embodiment of the present invention and another example of the transfer method.
Figure 13B:
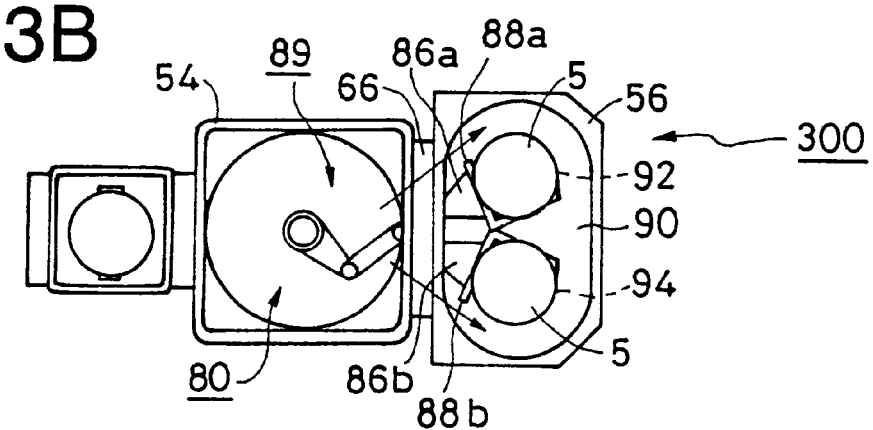
Figure 13C:
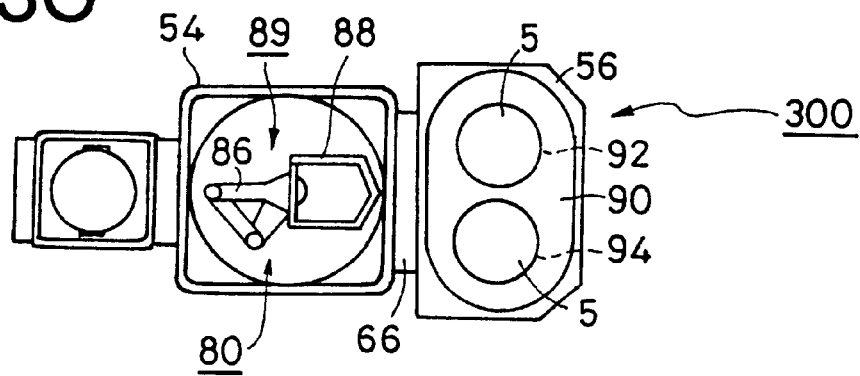

With reference to FIGS. 12A to 12E, it has been described the method for opening, in the horizontal direction, the wafer mounting portions 88*a* and 88*b* which are the respective tip ends of the wafer mounting arms 86*a* and 86*b* by rotating and opening the wafer mounting arms 86*a* and 86*b* of the wafer transfer robot 80 after the arm 89 of the wafer transfer robot 80 is extended into the reaction processing chamber 56. It is also possible to open, in the horizontal direction, the wafer mounting portions 88*a* and 88*b* which are the respective tip ends of the wafer mounting arms 86*a* and 86*b*, by rotating and opening the wafer mounting arms 86*a* and 86*b* of the wafer transfer robot 80 while the arm 89 of the wafer transfer robot 80 is being extended into the reaction processing chamber 56, as shown in FIGS. 13A and 13B. With this method, it is possible to reduce the opening width of the gate valve 66, and also to simply manufacture the connection module 300 at a low price.

Alternatively, the wafers 5 may be mounted to the susceptor 90 one by one. This method will be explained with reference to FIGS. 14A to 14F.

Figure 14A:
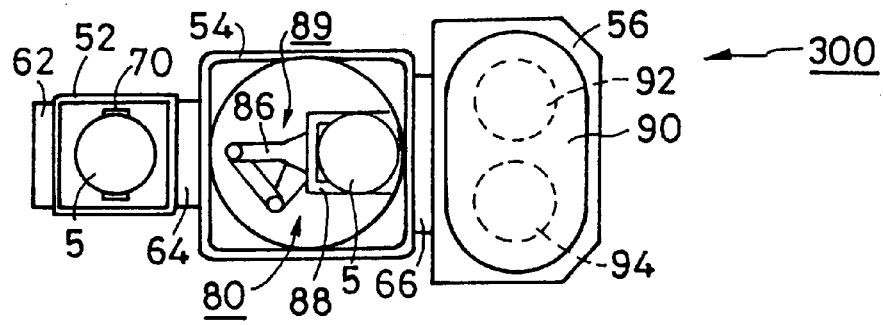
FIGS. 14A to 14F are schematic transverse sectional views for explaining still another example of the wafer transfer robot in the connection module of the one embodiment of the present invention and still another example of the transfer method.

First, as shown in FIG. 14A, wafer mounting portions which are the respective tip ends of the two wafer mounting arms 86 are superposed in a vertical direction by closing the two wafer mounting arms 86, and the two wafers 5 mounted in the slots of the wafer boat 70 are simultaneously received onto the two wafer mounting portions 88.

Figure 14B:
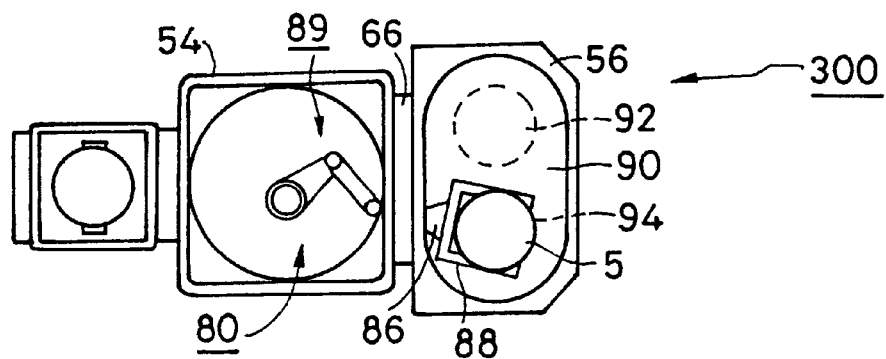

Then, as shown in FIG. 14B, the arm 89 of the wafer transfer robot 80 is extended into the reaction processing chamber 56, and the wafer mounting portion 88 which is the tip end of the wafer mounting arm 86 of the wafer transfer robot 80 is positioned above the wafer mounting curved portion 94 of the susceptor 90.

Figure 14C:
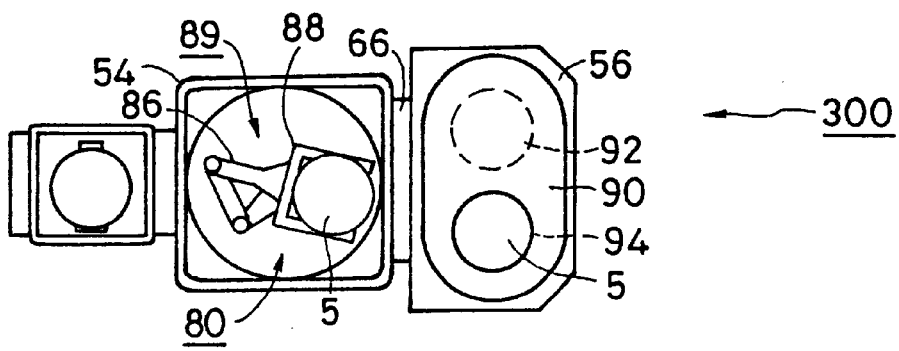

Thereafter, as shown in FIG. 14C, a lower one of the two wafers 5 is mounted on the wafer mounting curved portion 94 of the susceptor 90 by the cooperation of the wafer mounting arm 86 and the pins 911, 912, 913 (see FIGS. 8 and 9) or by the cooperation of the wafer mounting arm 86 and the pedestal 920 (see FIGS. 10 and 11).

Figure 14D:
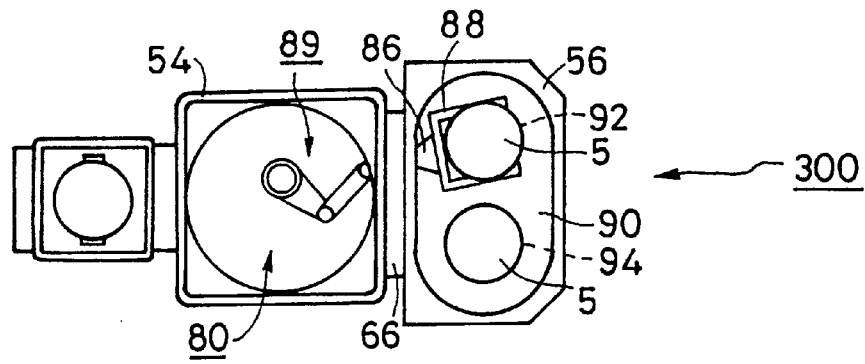

Then, as shown in FIG. 14D, the wafer mounting portion 88 which is the tip end of the wafer mounting arm 86 of the wafer transfer robot 80 is positioned above the wafer mounting curved portion 92.

Figure 14E:
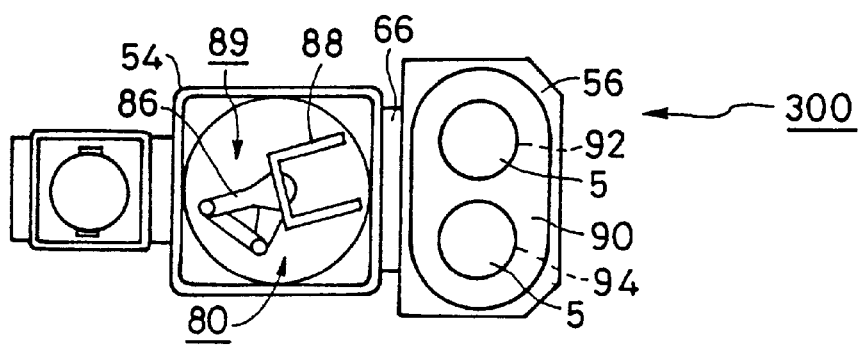

Then, as shown in FIG. 14E, the remaining one wafer 5 is mounted on the wafer mounting curved portion 92 by the cooperation of the wafer mounting arm 86 and the pins 911, 912, 913 (see FIGS. 8 and 9) or by the cooperation of the wafer mounting arm 86 and the pedestal 920 (see FIGS. 10 and 11).

Figure 14F:
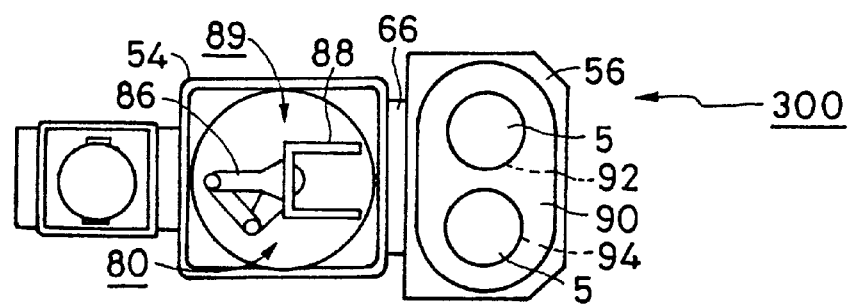

Lastly, the arm 89 of the wafer transfer robot 80 is accommodated in the transfer chamber 54 as shown in FIGS. 14E and 14F.

The method for transferring the wafers 5 from the wafer boat 70 in the load lock chamber 52 to the susceptor 90 in the reaction processing chamber 56 has been explained above. The wafers 5 can be transferred from the susceptor 90 to the wafer boat 70 by substantially the opposite procedures and therefore, the explanation of the opposite procedures is omitted here.

According to a first aspect of the above-described preferred embodiments, there is provided a first substrate processing apparatus, comprising:

a substrate transfer section;

a first module attached to the substrate transfer section; and first substrate transfer means disposed in the substrate transfer section and capable of transferring a substrate or substrates to the first module, wherein the first module comprises:

a substrate processing chamber, having a hermetic structure, for processing the substrate or the substrates;

first and second intermediate chambers provided between the substrate processing chamber and the substrate transfer section, each of the first and second intermediate chambers having a hermetic structure, the first intermediate chamber being located closer to the substrate processing chamber than the second intermediate chamber, and the second intermediate chamber being located closer to the substrate transfer section than the first intermediate chamber;

a first valve provided between the substrate processing chamber and the first intermediate chamber, the first valve being capable of establishing hermetic isolation between the substrate processing chamber and the first intermediate chamber when the first valve is closed and being capable of allowing the substrate or the substrates to pass through the first valve when the first valve is opened;

a second valve provided between the first and second intermediate chambers, the second valve being capable of establishing hermetic isolation between the first and second intermediate chambers when the second valve is closed and being capable of allowing the substrate or the substrates to pass through the second valve when the second valve is opened; and a third valve provided between the second intermediate chamber and the substrate transfer section, the third valve being capable of establishing hermetic isolation between the second intermediate chamber and the substrate transfer section when the third valve is closed and being capable of allowing the substrate or the substrates to pass through the third valve when the third valve is opened, wherein the second intermediate chamber is provided with first substrate holding means capable of holding a plurality of the substrates such that the plurality of substrates are stacked in a substantially vertical direction, wherein the substrate processing chamber is provided with second substrate holding means capable of holding a plurality of the substrates such that the plurality of substrates are arranged side by side in a substantially horizontal direction, and wherein the first intermediate chamber is provided with second substrate transfer means capable of mounting a plurality of the substrates held in a substantially vertical direction by the first substrate holding means, onto the second substrate holding means such that the plurality of substrates are arranged side by side in a substantially horizontal direction.

According to a second aspect of the above-described preferred embodiments, there is provided a second substrate processing apparatus, comprising:

a substrate transfer section;

a plurality of second modules attached to the substrate transfer section; and first substrate transfer means disposed in the substrate transfer section and capable of transferring a substrate or substrates to the plurality of second modules, wherein each of the plurality of second modules comprises:

a substrate processing chamber, having a hermetic structure, for processing the substrate or the substrates;

first and second intermediate chambers provided between the substrate processing chamber and the substrate transfer section, each of the first and second intermediate chambers having a hermetic structure, the first intermediate chamber being located closer to the substrate processing chamber than the second intermediate chamber, and the second intermediate chamber being located closer to the substrate transfer section than the first intermediate chamber;

a first valve provided between the substrate processing chamber and the first intermediate chamber, the first valve being capable of establishing hermetic isolation between the substrate processing chamber and the first intermediate chamber when the first valve is closed and being capable of allowing the substrate or the substrates to pass through the first valve when the first valve is opened;

a second valve provided between the first and second intermediate chambers, the second valve being capable of establishing hermetic isolation between the first and second intermediate chambers when the second valve is closed and being capable of allowing the substrate or the substrates to pass through the second valve when the second valve is opened; and a third valve provided between the second intermediate chamber and the substrate transfer section, the third valve being capable of establishing hermetic isolation between the second intermediate chamber and the substrate transfer section when the third valve is closed and being capable of allowing the substrate or the substrates to pass through the third valve when the third valve is opened, wherein the second intermediate chamber is provided with first substrate holding means capable of holding a plurality of the substrates such that the plurality of substrates are stacked in a substantially vertical direction, wherein the substrate processing chamber is provided with second substrate holding means capable of holding a plurality of the substrates such that the plurality of substrates are arranged side by side in a substantially horizontal direction, and wherein the first intermediate chamber is provided with second substrate transfer means capable of mounting the plurality of substrates held in a substantially vertical direction by the first substrate holding means, onto the second substrate holding means such that the plurality of substrates are arranged side by side in a substantially horizontal direction.

The first substrate processing apparatus of the present invention is provided with the first substrate transfer means capable of transferring a substrate or substrates to the first module, the first substrate holding means provided in the first module, and the second substrate transfer means provided in the first module and capable of mounting substrates from the first substrate holding means onto the second substrate holding means in the substrate processing chamber. Therefore, a substrate transfer operation to the first module and a substrate transfer operation within the first module can be independent from each other. As a result, the substrate can be transferred efficiently, and the throughput is enhanced.

The second substrate processing apparatus of the present invention is provided with the first substrate transfer means capable of transferring a substrate or substrates to the second modules, the first substrate holding means provided in each of the second modules, and the second substrate transfer means provided in each of the second modules and capable of mounting substrates onto the second substrate holding means in the substrate processing chamber from the first substrate holding means. Therefore, a substrate transfer operation to the second module and a substrate transfer operation within the second module can be independent from each other. As a result, the substrate can be transferred efficiently, and the throughput is enhanced.

In the second substrate processing apparatus, the plurality of second modules each having the substrate processing chamber are attached to the substrate transfer portion and therefore, the processing efficiency of the substrate can be enhanced.

Further, first module of the first substrate processing apparatus and each of the plurality of second modules of the second substrate processing apparatus comprises: the substrate processing chamber having a hermetic structure, for processing the substrate or the substrates; first and second intermediate chambers provided between the substrate processing chamber and the substrate transfer section, each of the first and second intermediate chambers having a hermetic structure, the first intermediate chamber being located closer to the substrate processing chamber than the second intermediate chamber, and the second intermediate chamber being located closer to the substrate transfer section than the first intermediate chamber; a first valve provided between the substrate processing chamber and the first intermediate chamber, the first valve being capable of establishing hermetic isolation between the substrate processing chamber and the first intermediate chamber when the first valve is closed and being capable of allowing the substrate or the substrates to pass through the first valve when the first valve is opened; a second valve provided between the first and second intermediate chambers, the second valve being capable of establishing hermetic isolation between the first and second intermediate chambers when the second valve is closed and being capable of allowing the substrate or substrates to pass through the second valve when the second valve is opened; and a third valve provided between the second intermediate chamber and the substrate transfer section, the third valve being capable of establishing hermetic isolation between the second intermediate chamber and the substrate transfer section when the third valve is closed and being capable of allowing the substrate or the substrates to pass through the third valve when the third valve is opened. Therefore, it is possible to independently keep the first and the second intermediate chambers and the substrate processing chamber of the first module of the first substrate processing apparatus in respective hermetically sealed states, and it is possible to independently keep the first and the second intermediate chambers and the substrate processing chamber of each of the plurality of second modules of the second substrate processing apparatus in respective hermetically sealed states. Also, in the first module of the first substrate processing apparatus, it is possible to independently bring the first and the second intermediate chambers and the substrate processing chamber into a predetermined gas atmosphere or a vacuum atmosphere. Also in each of the plurality of second modules of the second substrate processing apparatus, as well as among the plurality of second modules of the second substrate processing apparatus, it is possible to independently bring the first and the second intermediate chambers and the substrate processing chamber into a predetermined gas atmosphere or a vacuum atmosphere. Further, the substrate or the substrates can move between the substrate processing chamber and the first intermediate chamber, between the first and the second intermediate chambers, and between the second intermediate chamber and the substrate transfer section, respectively. Because it is possible to independently keep the first and the second intermediate chambers and the substrate transfer chamber in respective hermetically sealed states as described above, the second intermediate chamber can function as a load lock chamber. Gate valves are preferably used as the first and the second valves.

Moreover, because first substrate holding means is further provided in addition to the second substrate transfer means, the substrate holding function and the substrate transferring function can be separated. Therefore, for example, while the substrate holding means holds a substrate for cooling it, the substrate transfer means can transfer another substrate to the substrate processing chamber and thus, the substrate can be processed more efficiently.

Further, because the second intermediate chamber is provided with the first substrate holding means capable of holding the plurality of substrates in a state where the plurality of the substrates are stacked in a substantially vertical direction, it is possible to simultaneously transfer a plurality of the substrates to this first substrate holding means, and to transfer the substrates from the first substrate holding means. Therefore, the substrate transfer efficiency and the throughput can be enhanced.

The first substrate holding means can hold a plurality of the substrates in a state where the plurality of the substrates are stacked in a substantially vertical direction. Therefore, when a semiconductor wafer or the like is used as the substrate for example, and a semiconductor wafer cassette is used in the substrate transfer section, a plurality of semiconductor wafers can be transferred between the cassette and the first substrate holding means in a state where the semiconductor wafers are kept being stacked and thus, a structure of the first substrate transfer means can be simplified.

The substrate processing chamber is provided with the second substrate holding means capable of holding a plurality of the substrates in a state where the plurality of the substrates are arranged side by side in a substantially horizontal direction. Therefore, the substrate processing efficiency in the substrate processing chamber is enhanced, and the throughput is enhanced.

Because the second substrate holding means can hold a plurality of the substrates in a state where the plurality of the substrates are arranged side by side in a substantially horizontal direction, a plasma processing and the like can be conducted uniformly among the plurality of substrates in the substrate processing chamber.

In the substrate processing apparatus of the present invention, a plurality of the substrates held by the first substrate holding means in the substantially vertical direction can be mounted on the second substrate holding means in a state where the substrates are arranged side by side in the substantially horizontal direction by the second substrate transfer means.

Preferably, the second substrate transfer means is capable of mounting, the plurality of substrates held by the second substrate holding means such that the substrates are arranged side by side in a substantially horizontal direction, onto the first substrate holding means such that the plurality of substrates are stacked in a substantially vertical direction.

With this construction, in the first module of the first substrate processing apparatus, as well as in each of the plurality of second modules of the second substrate processing apparatus, the substrates can be transferred between the second substrate holding means and the first substrate holding means by the second substrate transfer means in both directions, respectively.

Therefore, especially in the second substrate processing apparatus, the substrate can be transferred into and out from the substrate processing chamber irrespective of a processing state in the other substrate processing chambers of the other second modules. As described above, in the second substrate processing apparatus, each of the plurality of second modules is provided with the substrate processing chamber and the second substrate transfer means and therefore, the substrate can be transferred into and out from the substrate processing chamber irrespective of a processing state in the other substrate processing chambers of the other second modules. As a result, it is possible to constantly keep a time period in which each of the substrates is heated in each of the plurality of second modules.

Preferably, the second substrate transfer means is capable of substantially simultaneously receiving a plurality of the substrates from the first substrate holding means in a state where the substrates are stacked in a substantially vertical direction, and is capable of mounting the plurality of substrates thereafter on the second substrate holding means in a state where the plurality of substrates are arranged side by side in a substantially horizontal direction.

With the above feature, because the second substrate transfer means can substantially simultaneously receive a plurality of the substrates from the first substrate holding means, the substrate transfer efficiency is enhanced and the throughput is enhanced.

Preferably, the second substrate transfer means is capable of receiving a plurality of the substrates which are arranged side by side in a substantially horizontal direction and held by the second substrate holding means, and is capable of substantially simultaneously mounting the plurality of substrates thereafter onto the first substrate holding means in a state where the plurality of substrates are stacked in a substantially vertical direction.

With the above feature, because the second substrate transfer means can substantially simultaneously mount a plurality of the substrates on the first substrate holding means, the substrate transfer efficiency is enhanced and the throughput is enhanced.

Preferably, the second substrate transfer means is capable of mounting a plurality of the substrates one by one onto the second substrate holding means, and/or is capable of receiving a plurality of the substrates one by one from the second substrate holding means. With this feature, a structure of the second substrate transfer means can be simplified.

Preferably, the second substrate transfer means is capable of simultaneously mounting a plurality of the substrates onto the second substrate holding means, and/or is capable of simultaneously receiving a plurality of the substrates from the second substrate holding means. With this feature, the substrate transfer efficiency is further enhanced and the throughput is also further enhanced.

Preferably, the second substrate transfer means is an articulated robot.

In this case, preferably, the articulated robot includes a plurality of joints and a plurality of arms, the forefront arm of the plurality of arms is a substrate mounting arm capable of mounting the substrate or the substrates, and the substrate mounting arm is capable of, in a state where the substrate mounting arm is extended toward the second substrate holding means, mounting the substrate or the substrates onto the second substrate holding means utilizing the substrate mounting arm and/or receiving the substrate or the substrates from the second substrate holding means utilizing the substrate mounting arm.

In this manner, because the substrate mounting arm is capable of, in a state where the substrate mounting arm is extended toward the second substrate holding means, mounting the substrate or the substrates onto the second substrate holding means utilizing the substrate mounting arm and/or receiving the substrate or the substrates from the second substrate holding means utilizing the substrate mounting arm, a width of an opening of the first valve provided between the substrate processing chamber and the first intermediate chamber can be reduced. As a result, the first module in the first substrate processing apparatus and the plurality of second modules in the second substrate processing apparatus can simply be manufactured at low prices.

Preferably, the substrate mounting arm includes a plurality of auxiliary substrate mounting arms mounted to the same joint, and in a state where substrate mounting sections of the plurality of auxiliary mounting arms are stacked in a substantially vertical direction by closing the plurality of auxiliary substrate mounting arms, a plurality of the substrates stacked in a substantially vertical direction can substantially simultaneously be received by the plurality of the auxiliary substrate mounting arms from the first substrate holding means and/or a plurality of the substrates stacked in a substantially vertical direction can substantially simultaneously be mounted by the plurality of the auxiliary substrate mounting arms onto the first substrate holding means.

With the above feature, it is possible to easily achieve a simultaneous receipt of a plurality of the substrates between the first substrate holding means and the second substrate transfer means. Therefore, the substrate transfer efficiency is further enhanced, and the throughput is further enhanced.

Preferably, the substrate mounting arm includes a plurality of auxiliary substrate mounting arms mounted to the same joint, and in a state where substrate mounting sections of the plurality of auxiliary mounting arms are opened in a substantially horizontal direction by opening the plurality of auxiliary mounting arms around the joint, a plurality of the substrates can substantially simultaneously be received from the second substrate holding means by the plurality of auxiliary substrate mounting arms and/or a plurality of the substrates can substantially simultaneously be mounted by the plurality of auxiliary substrate mounting arms onto the second substrate holding means in a state where the plurality of substrates are arranged side by side in a substantially horizontal direction.

With the above feature, it is possible to easily achieve a simultaneous receipt of a plurality of the substrates between the second substrate holding means and the second substrate transfer means. Therefore, the substrate transfer efficiency is further enhanced, and the throughput is further enhanced.

Preferably, the substrate mounting sections of the plurality of auxiliary substrate mounting arms can be opened in a substantially horizontal direction by first extending the substrate mounting arm toward the second substrate holding means, and then opening the plurality of auxiliary substrate mounting arms around the joint, and in a state where the substrate mounting sections of the plurality of auxiliary substrate mounting arms are opened in a substantially horizontal direction by opening the plurality of auxiliary substrate mounting arms around the joint, the plurality of substrates can substantially simultaneously be received from the second substrate holding means utilizing the plurality of auxiliary substrate mounting arms and/or the plurality of substrates can substantially simultaneously be mounted on the second substrate holding means in a state where the plurality of substrates are arranged side by side in a substantially horizontal direction utilizing the plurality of auxiliary substrate mounting arms.

With the above feature, it is possible to easily achieve a simultaneous receipt of a plurality of the substrates between the second substrate holding means and the second substrate transfer means. Therefore, it is possible not only to further enhance the substrate transfer efficiency, but also to reduce a width of an opening of the first valve provided between the substrate processing chamber and the first intermediate chamber. As a result, the first module in the first substrate processing apparatus and the plurality of second modules in the second substrate processing apparatus can simply be manufactured at low prices.

Preferably, the substrate mounting sections of the plurality of auxiliary substrate mounting arms can be opened in a substantially horizontal direction by opening the plurality of auxiliary substrate mounting arms around the joint while extending the substrate mounting arm toward the second substrate holding means, and in a state where the substrate mounting sections of the plurality of auxiliary substrate mounting arms are opened in a substantially horizontal direction by opening the plurality of auxiliary substrate mounting arms around the joint, the plurality of substrates can substantially simultaneously be received from the second substrate holding means utilizing the plurality of auxiliary substrate mounting arms and/or the plurality of substrates can substantially simultaneously be mounted on the second substrate holding means in a state where the plurality of substrates are arranged side by side in a substantially horizontal direction utilizing the plurality of auxiliary substrate mounting arms.

Also with the above feature, it is possible to easily achieve a simultaneous receipt of a plurality of the substrates between the second substrate holding means and the second substrate transfer means. Therefore, it is possible not only to further enhance the substrate transfer efficiency, but also to reduce a width of an opening of the first valve provided between the substrate processing chamber and the first intermediate chamber. As a result, the first module in the first substrate processing apparatus and the plurality of second modules in the second substrate processing apparatus can simply be manufactured at low prices.

Preferably, the plurality of auxiliary substrate mounting arms are opened and closed utilizing bevel gears.

Preferably, the substrate processing apparatus according to the present invention further comprises substrate elevating means capable of moving the substrate up and down with respect to the second substrate holding means.

With the above feature, it becomes unnecessary to provide means for moving the second substrate transfer means up and down, and it also becomes unnecessary to provide the second substrate transfer means with a mechanism for moving up and down the substrate being transferred by the second substrate transfer means. Therefore, structures of the second substrate transfer means and the first and the second substrate processing apparatuses becomes simpler, and it becomes possible to manufacture them at low prices.

More preferably, the second substrate holding means includes a plurality of substrate holding sections for holding a plurality of the substrates, respectively, and a degree of up and down movement by the substrate elevator means is variable depending upon each of the plurality of substrate holding sections.

With the above feature, and when the second substrate transfer means is provided with a plurality of auxiliary substrate mounting arms, for example, and when the substrate mounting sections of the plurality of auxiliary substrate mounting arms are opened in a substantially horizontal direction, even though there is a difference in height between the substrate mounting sections of the plurality of auxiliary substrate mounting arms, the plurality of the substrates can easily be mounted on the second substrate holding means, and the plurality of substrates can easily be received from the second substrate holding means.

Preferably, the second substrate holding means is a susceptor, and the substrate elevator means is pins or pedestals capable of moving up and down with respect to the susceptor.

In the substrate processing chamber of each of the first and second substrate processing apparatuses of the present invention, the following processes are preferably conducted: a film formation of an insulation film, a wiring metal film, a polycrystalline silicon film, an amorphous film and the like by using various CVD methods such as a plasma enhanced CVD method, a hot wall CVD method, a photo enhanced CVD method; an etching; a heat treatment such as annealing; an epitaxial growth; a diffusing, etc.

In the present invention, the second substrate holding means of the substrate processing chamber can hold a plurality of the substrates arranged side by side in a substantially horizontal direction. Therefore, in the substrate processing chamber of each of the first and the second substrate processing apparatus of the present invention, a plasma processing for processing substrates utilizing plasma, such as plasma enhanced etching, plasma enhanced CVD and plasma enhanced ashing, is more preferably conducted.

When a plurality of the substrates are held in a state where they are arranged side by side in a substantially horizontal direction, it is possible to substantially equalize respective distances between the plurality of the substrates and an electrode of the plasma processing apparatus. As a result, density of plasma to which the plurality of substrates are exposed are equalized among the substrates so that the plasma processing can uniformly be conducted among the plurality of the substrates.

Preferably, the second substrate transfer means is capable of simultaneously transferring the same number of substrates as those to be processed at a time in the substrate processing chamber.

Preferably, the first substrate holding means is capable of holding at least twice as many substrates as that or those processed at a time in the substrate processing chamber.

With the above feature, while a substrate is or substrates are processed in the substrate processing chamber, another substrate or other substrates to be processed thereafter can be held beforehand, and after the substrate or the substrates which has or have been processed is or are taken out from the substrate processing chamber into the first substrate holding means, the substrate or the substrates to be processed thereafter can immediately be supplied to the substrate processing chamber. As a result, the substrate can efficiently be processed, and the throughput can be enhanced.

It is preferable that the first substrate holding means can hold at least twice as many substrates as that or those the second substrate holding means can hold. With this feature, the first substrate holding means can hold at least twice as many substrates as that or those processed at a time in each of the substrate processing chambers. Therefore, while a substrate is or substrates are processed in the substrate processing chamber, another substrate or other substrates to be processed thereafter can be held beforehand, and after the substrate or the substrates which has or have been processed is or are taken out from the substrate processing chamber into the first substrate holding means, the substrate or the substrates to be processed thereafter can immediately be supplied to the substrate processing chamber. As a result, the substrates can efficiently be processed, and the throughput can be enhanced.

More preferably, the first substrate holding means includes a pre-processed substrate holding section for holding a substrate or substrates before processing in the substrate processing E chamber, and a post-processed substrate holding section for holding a substrate or substrates after processing in the substrate processing chamber, and the post-processed substrate holding section is different from the pre-processed substrate holding section.

With the above feature, while a substrate is or substrates are processed in the substrate processing chamber, another substrate or substrates to be processed thereafter can be held by the pre-processed substrate holding section of the first substrate holding means beforehand, and the post-processed substrate or substrates taken out from the substrate processing chamber can be held by the post-processed substrate holding section of the first substrate holding means. Therefore, after the post-processed substrate is or substrates are taken out and held in the post-processed substrate holding section, another substrate or other substrates to be processed thereafter can immediately be supplied from the pre-processed substrate holding section into the substrate processing chamber. As a result, the substrate can efficiently be processed, and the throughput can be enhanced.

Preferably, the substrate processing apparatus further comprises elevating means capable of moving the first substrate holding means up and down. When the first substrate holding means is thus made to be moved up and down, it becomes unnecessary to provide the second substrate transfer means with an elevator function. As a result, the structure of the second substrate transfer means becomes simplified, and the second substrate transfer means can be manufactured at a low price.

Preferably, the first substrate holding means is a heat-resistant substrate holding means.

With this feature, a substrate which has been processed can immediately be transferred to the first substrate holding means, which enhances the substrate transferring efficiency. Further, a substrate which has been processed can be cooled by the first substrate holding means and thus, the first intermediate chamber in which the first substrate holding means is provided can be used as a substrate cooling chamber for cooling a high-temperature substrate which has been processed in the substrate processing chamber.

The heat resistant first substrate holding means is preferably made of quartz, glass, ceramics or metal. When the first substrate holding means is made of such material, impurities such as outgas are not generated from the first substrate holding means even when the first intermediate chamber is evacuated, and therefore, it is possible to keep the atmosphere in the first intermediate chamber clean. As ceramics, a sintered SiC, a sintered SiC on which $SiO_2$ film is CVD-coated, and an alumina and the like are preferably used.

Preferably, the first substrate transfer means can simultaneously transfer a plurality of the substrates. With this feature, the substrate transferring efficiency is further enhanced, and the throughput is further enhanced also.

Preferably, each of the first module and the plurality of second modules comprises:

the substrate processing chamber, having a hermetic structure of vacuum level, for processing the substrate or the substrates;

the first and second intermediate chambers provided between the substrate processing chamber and the substrate transfer section, each of the first and second intermediate chambers having a hermetic structure of vacuum level, the first intermediate chamber being located closer to the substrate processing chamber than the second intermediate chamber, and the second intermediate chamber being located closer to the substrate transfer section than the first intermediate chamber;

the first valve provided between the substrate processing chamber and the first intermediate chamber, the first valve being capable of establishing hermetic isolation of vacuum level between the substrate processing chamber and the first intermediate chamber when the first valve is closed and being capable of allowing the substrate or the substrates to pass through the first valve when the first valve is opened;

the second valve provided between the first and second intermediate chambers, the second valve being capable of establishing hermetic isolation of vacuum level between the first and second intermediate chambers when the second valve is closed and being capable of allowing the substrate or the substrates to pass through the second valve when the second valve is opened; and the third valve provided between the second intermediate chamber and the substrate transfer section, the third valve being capable of establishing hermetic isolation of vacuum level between the second intermediate chamber and the substrate transfer section when the third valve is closed and being capable of allowing the substrate or the substrates to pass through the third valve when the third valve is opened.

With the above feature, it is possible to independently keep the first and the second intermediate chambers and the substrates processing chamber of the first module of the first substrate processing apparatus in respective hermetically sealed states of vacuum level, and it is possible to independently keep the first and second intermediate chamber and the substrate processing chamber of each of the plurality of second modules of the second substrate processing apparatus in respective hermetically sealed states of vacuum level. Also, in the first module of the first substance processing apparatus, it is possible to independently bring the first and the second intermediate chambers and the substrate processing chamber into a predetermined vacuum atmosphere. Also, in each of the plurality of second modules of the second substrate processing apparatus, as well as among the plurality of second modules of the second substrate processing apparatus, it is possible to independently bring the first and second intermediate chambers and the substrate processing chamber into a predetermined vacuum atmosphere. Further, the substrate or the substrates can move between the substrate processing chamber and the first intermediate chamber, between the first and the second intermediate chambers, and between the second intermediate chamber and the substrate transfer section, respectively. Because it is possible to independently keep the first and the second intermediate chambers and the substrate transfer chamber in respective hermetically sealed states of vacuum level as described above, the second intermediate chamber can function as a load lock chamber.

Further, because the first intermediate chamber having such a hermetic structure of vacuum level is provided with the second substrate transfer means capable of transferring the substrate or the substrates between the first substrate holding means and the substrate processing chamber, a substrate transfer to the first module of the first substrate processing apparatus and to each of the plurality of second modules of the second substrate processing apparatus can be effected under atmospheric pressure by the first substrate transfer means provided in the substrate transfer section, and a substrate transfer under vacuum can be performed by the second substrate transfer means provided in the first intermediate chamber of the first module of the first substrate processing apparatus and each of the plurality of second modules of the second substrate processing apparatus. Therefore, it is unnecessary that all of regions in which mechanisms for transferring a substrate is or substrates are provided are formed into hermetic structures of vacuum level, and the substrate transfer section for transferring a substrate or substrates to the first module of the first substrate processing apparatus and to each of the plurality of second modules of the second substrate processing apparatus can be a region in which a substrate or substrates are transferred under atmospheric pressure. Therefore, a region having the hermetic structures of vacuum level can be divided into the first intermediate chamber of the first module of the first substrate processing apparatus and the first intermediate chamber of each of the plurality of second modules of the second substrate processing apparatus. As a result, structures of the substrate transfer section and the first substrate transfer means can be simplified, and they can be manufactured at low prices. Further, a volume of the first intermediate chamber of the first module of the first substrate processing apparatus and a volume of the first intermediate chamber of each of the plurality of second modules of the second substrate processing apparatus becomes small, and even though the wall thicknesses of the first intermediate chambers are made thinner, enough strength can be secured and as a result, the first intermediate chambers can be manufactured at a low price. Furthermore, also in the second substrate transfer means provided in the first intermediate chamber, a vertical movement in a vertical direction can be suppressed to a minimum within a required range and therefore, its manufacturing cost is lowered. Further, particles can also be suppressed to the minimum, particles which may be generated from the driving section of the second substrate transfer means in the first intermediate chamber having the hermetic structure of vacuum level.

The second intermediate chamber similarly having the hermetic structure of vacuum level is provided in the first module of the first substrate processing apparatus and in each of the plurality of second modules of the second substrate processing apparatus. Therefore, volumes of the second intermediate chambers are reduced, and even though the wall thicknesses of the second intermediate chambers are made thinner, enough strength can be secured and as a result, the second intermediate chambers can be manufactured at a low price.

Further, in the first and the second substrate processing apparatuses, when the substrate processing chamber and the first and the second intermediate chambers have the hermetic structures of vacuum level, it is preferable that the substrate processing chamber and the first and the second intermediate chambers can be evacuated. In such a case, it is more preferable that the substrate processing chamber and the first and the second intermediate chambers can be evacuated independently of each other.

It is preferable that in the substrate transfer section, a substrate or substrates are transferred under atmospheric pressure.

When the substrate transfer section is a transfer section for transferring a substrate or substrates under atmospheric pressure, a structure of the first substrate transfer means provided in the substrate transfer section can be simple, and the first substrate transfer means can be manufactured at a low price. In addition, it is unnecessary to provide the substrate transfer section in a chamber having a hermetic structure, and it is enough to simply cover the substrate transfer section with a housing. Therefore, its structure is simplified and manufacturing cost can be lowered.

The first and the second substrate processing apparatuses of the present invention especially effectively function when the substrate transfer section is a transfer section for transferring a substrate or substrates under atmospheric pressure, and the substrate processing chamber is a processing chamber for processing a substrate or substrates under a reduced pressure.

In the second substrate processing apparatus of the present invention, it is preferable that the plurality of second modules are piled up in a vertical direction and separated from one another, and each of the plurality of second modules is detachably attached to the substrate transfer section.

Because the plurality of second modules are piled up in the vertical direction as described above, even though a plurality of the second modules are used to enhance the substrate processing efficiency, an area in the clean room occupied by the second substrate processing apparatus is not increased, and a maintenance region for the apparatus is not increased.

Further, because the plurality of second modules thus piled up in the vertical direction as described above are separated from one another and detachably attached to the substrate transfer section, when any one of the second modules require a maintenance, only the second module which requires the maintenance can easily be detached, and while maintenance is conducted for the second module, other second modules can be operated. As a result, a net working rate can remarkably be enhanced.

Because the plurality of second modules are separated from one another and detachably attached to the substrate transfer section, the number of the second modules to be attached to the substrate transfer section can suitable be selected in accordance with the number of substrates which are required to be processed per hour and a kind of processing.

Figure 17:
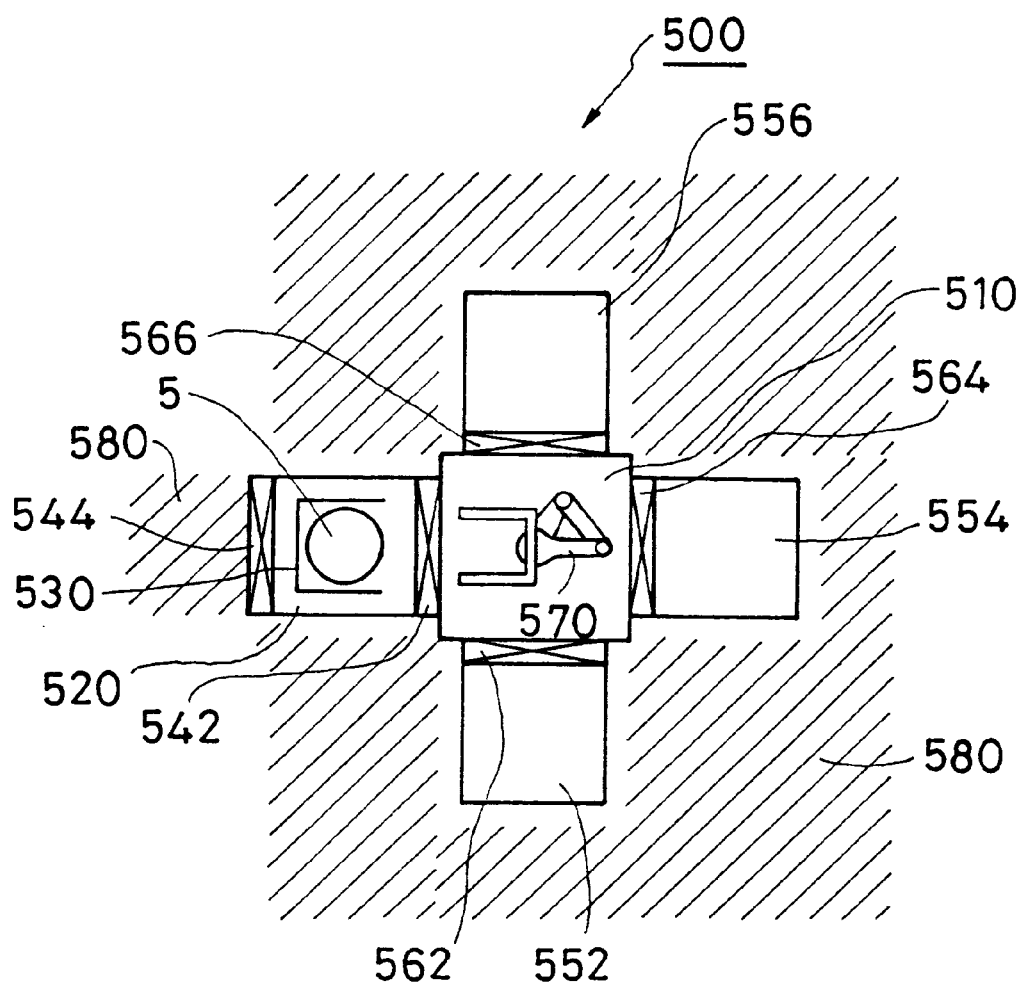
FIG. 17 is a plan view for explaining a conventional semiconductor wafer processing apparatus.

In contrast, in the conventional plasma CVD apparatus 500 as shown in FIG. 17, three reaction processing chambers 552, 554 and 556 are provided to enhance the throughput. In order to further enhance the throughput, it is necessary to increase the number of corners or angles of the load lock chamber 510, that is to increase the number of sides of the load lock chamber 510, so as to increase the number of reaction chambers 552, 554 and 556. If the number of corners or angles of the load lock chamber 510 or the number of sides of the load lock chamber 510 is increased for the purpose of enhancing the throughput, not only the load lock chamber 510 is increased in size, but also maintenance spaces for the reaction processing chambers 552, 554 and 556 coupled to the load lock chamber 510 are increased. As a result, an area occupied by the apparatus is increased.

In a semiconductor manufacturing plant requiring a clean room, the cost of investment in plant and equipment and the cost of maintenance of the equipments are a heavy burden. In order to ease the burden, an apparatus which occupies a small area has strongly been desired. By piling up a plurality of second modules in a vertical direction as described above, even though the substrate processing efficiency is enhanced using the plurality of modules, an area of the clean room occupied by the second substrate processing apparatus is not increased, and a maintenance region for the apparatus is not increased.

In the first and the second substrate processing apparatus of the present invention, it is preferable that the substrate transfer section is further provided with the cassette holding means for holding the cassette which can accommodate a plurality of the substrates, and the first substrate transfer means can transfer the substrates between the cassette held by the cassette holding means and the first module of the first substrate processing apparatus and between the cassette held by the cassette holding means and each of the plurality of second modules of the second substrate processing apparatus.

In this case, it is preferable that the first substrate transfer means is provided with a structure capable of transferring the cassette.

With the above feature, because the first substrate transfer means can function as both the substrate transfer means and the cassette transfer means, one elevating means can commonly be used as both the elevating means for the substrate transfer means and the elevating means for the cassette transfer means. Therefore, the manufacturing cost for the elevator apparatus can be lowered, an area occupied by the substrate transfer section can be made small, resulting in reducing an area occupied by the first and the second substrate processing apparatuses.

In the first and the second substrate processing apparatuses of the present invention, it is preferable that the first substrate transfer means can suitably be used for the first module of the first substrate processing apparatus and for each of the plurality of second modules of the second substrate processing apparatus, by further providing the substrate transfer section with an elevator device capable of moving the first substrate transfer means up and down.

In the first and the second substrate processing apparatuses of the present invention, it is preferable that the substrate transfer section is further provided with a cassette introduction section, provided at a predetermined height different from the cassette holding means, for bringing the cassette into and/or out from the substrate transfer section.

In a semiconductor manufacturing plant, in order to be compatible with an automatic transfer robot, a height at which a cassette is introduced is determined in each of apparatuses in many cases. Therefore, in order to meet this requirement, it is preferable that the cassette introduction section be provided at a predetermined height. In this case, it is necessary to transfer a substrate from a cassette introduced in the cassette introduction section to each of the modules. In the present invention, the first substrate transfer means is provided with a structure capable of transferring the cassette, the substrate transfer section is provided with the elevator device capable of moving the first substrate transfer means up and down, and the substrate transfer section is provided with the cassette holding means for holding the cassette. Therefore, the cassette accommodating a plurality of substrates therein can first be transferred to a predetermined cassette holding means by the elevator device and the first substrate transfer means and then, the substrates can be transferred from the cassette by the first substrate transfer means to the first module of the first substrate processing apparatus and to each of the plurality of second modules of the second substrate processing apparatus and thus, the transfer efficiency of each of the substrates between the cassette introduction section and the first module of the first substrate processing apparatus and between the cassette introduction section and each of the plurality of second modules of the second substrate processing apparatus is enhanced.

According to a third aspect of the above-described preferred embodiments, there is provided a substrate transfer device capable of transferring a plurality of substrates between first substrate holding means capable of holding a plurality of the substrates such that the plurality of substrates are stacked in a substantially vertical direction and second substrate holding means capable of holding a plurality of the substrates such that the plurality of substrates are arranged side by side in a substantially horizontal direction, wherein the substrate transfer device includes a plurality of substrate mounting means capable of mounting the substrates, each of the plurality of substrate mounting means includes a substrate mounting section for mounting the substrate, in a state where the substrate mounting sections are stacked in a substantially vertical direction, a plurality of substrates stacked in a substantially vertical direction can substantially simultaneously be received from the first substrate holding means by the plurality of substrate mounting means and/or a plurality of the substrates can substantially simultaneously be mounted on the first substrate holding means by the plurality of substrate mounting means such that the plurality of substrates are stacked in a substantially vertical direction; and in a state where the substrate mounting sections are arranged side by side in a substantially horizontal direction, a plurality of the substrates can substantially simultaneously be received from the second substrate holding means by the plurality of substrate mounting means and/or a plurality of the substrates can substantially simultaneously be mounted on the second substrate holding means in a state where the plurality of substrates are arranged side by side in a substantially horizontal direction by the plurality of substrate mounting means.

When this substrate transfer device is used, it is possible to enhance the transfer efficiency of substrates between the first substrate holding means capable of holding a plurality of the substrates stacked in a substantially vertical direction and the second substrate holding means capable of holding a plurality of the substrates arranged side by side in a substantially horizontal direction.

Preferably, the plurality of substrate mounting means are capable of opening and closing with respect to each other around a single rotation center in a substantially horizontal direction, in a state where the substrate mounting sections are stacked in a substantially vertical direction by closing the plurality of substrate mounting means, a plurality of the substrates stacked in a substantially vertical direction can substantially simultaneously be received from the first substrate holding means by the plurality of substrate mounting means and/or a plurality of the substrates can substantially simultaneously be mounted on the first substrate holding means by the plurality of substrate mounting means such that the plurality of substrates are stacked in a substantially vertical direction, and in a state where the substrate mounting sections are arranged side by side in a substantially horizontal direction by opening the plurality of substrate mounting means with respect to each other around the rotation center in a substantially horizontal direction, a plurality of the substrates can substantially simultaneously be received from the second substrate holding means by the plurality of substrate mounting means and/or a plurality of the substrates can substantially simultaneously be mounted on the second substrate holding means in a state where the plurality of substrates are arranged side by side in a substantially horizontal direction by the plurality of substrate mounting means.

With the above feature, it is possible to realize a substrate transfer device having the above described function with a relatively simple structure.

In this case, preferably, the plurality of substrate mounting means are opened and closed utilizing bevel gears.

Preferably, the substrate transfer device is an articulated robot.

According to a fourth aspect of the above-described preferred embodiments, there is provided a substrate transfer apparatus, comprising:

first substrate holding means capable of holding a plurality of substrates such that the plurality of substrates are stacked in a substantially vertical direction;

second substrate holding means capable of holding a plurality of the substrates such that the plurality of substrates are arranged side by side in a substantially horizontal direction; and the above-described substrate transfer device capable of transferring the substrates between the first substrate holding means and the second substrate holding means.

When this substrate transfer apparatus is used, it is possible to enhance the transfer efficiency of the substrates between the first substrate holding means capable of holding a plurality of the substrates stacked in a substantially vertical direction and the second substrate holding means capable of holding a plurality of the substrates arranged side by side in a substantially horizontal direction.

Preferably, the substrate transfer apparatus further comprises substrate elevating means capable of moving a substrate or substrates up and down with respect to the substrate holding means.

With the above feature, it is unnecessary to provide means for moving the substrate transfer device up and down, and the substrate transfer device need not include a mechanism for moving up and down a substrate or substrates being transferred by the substrate transfer device. Therefore, structures of the substrate transfer device and the substrate transfer apparatus can be simple and they can be manufactured at low prices.

More preferably, the second substrate holding means includes a plurality of substrate holding sections for respectively holding each of the plurality of substrates, and a degree of up and down movement by the substrate elevating means is variable depending upon each of the plurality of substrate holding sections.

With the above feature, for example, by opening the plurality of substrate mounting means of the substrate transfer device around the center of rotation with respect to each other in a substantially horizontal direction, even though there exists differences in height among the substrate mounting sections of the plurality of substrate mounting means when the substrate mounting sections of the substrate mounting means are arranged side by side in a substantially horizontal direction, a plurality of the substrates can easily be mounted to and received from the second substrate holding means.

Preferably, the second substrate holding means is a susceptor, and the substrate elevating means are pins or pedestals capable of moving up and down with respect to the susceptor.

It is preferable that elevating means capable of moving the first substrate holding means up and down is further provided. When the first substrate holding means can be moved up and down in this manner, the substrate transfer device need not be provided with an elevating function. As a result, a structure of the substrate transfer device is simplified, and the substrate transfer device can be manufactured at a low price.

Preferably, the substrate transfer apparatus according to the present invention, further comprises:

a first chamber for accommodating the second substrate holding means;

a second chamber for accommodating the substrate transfer device; and a valve provided between the first and second chambers, the valve being capable of establishing hermetic isolation between the first and second chambers when the valve is closed, and is capable of allowing the substrate or the substrates to pass through the valve, wherein the substrate transfer device is an articulated robot, the articulated robot includes a plurality of joints and a plurality of arms, the forefront arm of the plurality of arms is a substrate mounting arm capable of mounting the substrate or the substrates, the substrate mounting arm comprises the plurality of substrate mounting means, the substrate mounting arm is capable of, in a state where the substrate mounting arm is extended toward the second substrate holding means, mounting the substrate or the substrates onto the second substrate holding means utilizing the substrate mounting means and/or receiving the substrate or the substrates from the second substrate holding means utilizing the substrate mounting means.

As described above, when the substrate or the substrates can be mounted on and/or received from the second substrate holding means utilizing the substrate mounting means in a state where the substrate mounting arm is extended toward the second substrate holding means, it is possible to reduce a width of an opening of the valve provided between the first and the second chambers. As a result, the substrate transfer apparatus can be manufactured simply at a low price.

Preferably, the substrate mounting arm can be first extended toward the second substrate holding means, and then the substrate mounting sections of the plurality of substrate mounting means are capable of opening in a substantially horizontal direction, and in a state where the substrate mounting sections of the plurality of substrate mounting means are arranged side by side in a substantially horizontal direction, a plurality of the substrates can substantially simultaneously be received from the second substrate holding means utilizing the substrate mounting means and/or a plurality of the substrates can substantially simultaneously be mounted on the second substrate holding means in a state where the plurality of substrates are arranged side by side in a substantially horizontal direction utilizing the plurality of substrate mounting means.

With the above feature, it is possible not only to easily and simultaneously transfer the plurality of substrates between the second substrate holding means and the substrate transfer device to enhance the substrate transfer efficiency, but also to reduce a width of an opening of the valve provided between the first and the second chambers. As a result, the substrate transfer apparatus can simply be manufactured at a low price.

Preferably, the substrate mounting sections of the plurality of substrate mounting means are capable of opening in a substantially horizontal direction while the substrate mounting arm is extended toward the second substrate holding means, and in a state where the substrate mounting sections of the plurality of substrate mounting means are arranged side by side in a substantially horizontal direction, a plurality of the substrates can substantially simultaneously be received from the second substrate holding means utilizing the plurality of substrate mounting means and/or a plurality of the substrates can substantially simultaneously be mounted on the second substrate holding means in a state where the plurality of substrates are arranged side by side in a substantially horizontal direction utilizing the plurality of substrate mounting means.

With also this feature, it is possible not only to easily and simultaneously transfer a plurality of the substrates between the second substrate holding means and the substrate transfer device to enhance the substrate transfer efficiency, but also to reduce a width of an opening of the valve provided between the first and the second chambers. As a result, the substrate transfer apparatus can simply be manufactured at a low price.

Preferably, the substrate transfer apparatus is a substrate processing apparatus.

Preferably, the substrate processing apparatus is a plasma processing apparatus for processing the substrate or the substrates utilizing plasma.

A semiconductor wafer is preferably used as the substrate to be processed according to the present invention. In such a case, each of the above described substrate processing apparatuses functions as a semiconductor wafer processing apparatus.

Further, a glass substrate for a liquid crystal display element and the like can be used as the substrate.

What is claimed is:

1. A substrate processing apparatus, comprising:

a substrate transfer section;

a module attached to said substrate transfer section; and first substrate transfer means disposed in said substrate transfer section and capable of transferring a substrate or substrates to said module, wherein said module includes a substrate processing chamber, having a hermetic structure, for processing said substrate or said substrates;

first and second intermediate chambers provided between said substrate processing chamber and said substrate transfer section, each of said first and second intermediate chambers having a hermetic structure, said first intermediate chamber being located closer to said substrate processing chamber than said second intermediate chamber, and said second intermediate chamber being located closer to said substrate transfer section than said first intermediate chamber;

a first valve provided between said substrate processing chamber and said first intermediate chamber, said first valve being capable of establishing hermetic isolation between said substrate processing chamber and said first intermediate chamber when said first valve is closed and being capable of allowing said substrate or said substrates to pass through said first valve when said first valve is opened;

a second valve provided between said first and second intermediate chambers, said second valve being capable of establishing hermetic isolation between said first and second intermediate chambers when said second valve is closed and being capable of allowing said substrate or said substrates to pass through said second valve when said second valve is opened; and a third valve provided between said second intermediate chamber and said substrate transfer section, said third valve being capable of establishing hermetic isolation between said second intermediate chamber and said substrate transfer section when said third valve is closed and being capable of allowing said substrate or said substrates to pass through said third valve when said third valve is opened, wherein said second intermediate chamber is provided with first substrate holding means capable of holding a plurality of said substrates such that said plurality of substrates are stacked in a substantially vertical direction, wherein said substrate processing chamber is provided with second substrate holding means capable of holding a plurality of said substrates such that said plurality of substrates are arranged side by side in a substantially horizontal direction, and wherein said first intermediate chamber is provided with second substrate transfer means capable of mounting a plurality of said substrates held in a substantially vertical direction by said first substrate holding means onto said second substrate holding means such that said plurality of substrates are arranged side by side in a substantially horizontal direction.

2. A substrate processing apparatus as recited in claim 1, wherein said second substrate transfer means is capable of mounting, said plurality of substrates held by said second substrate holding means such that said substrates are arranged side by side in a substantially horizontal direction, onto said first substrate holding means such that said plurality of substrates are stacked in a substantially vertical direction.

3. A substrate processing apparatus as recited in claim 1, wherein said second substrate transfer means is capable of substantially simultaneously receiving a plurality of said substrates from said first substrate holding means in a state where said substrates are stacked in a substantially vertical direction, and is capable of mounting said plurality of substrates thereafter on said second substrate holding means in a state where said plurality of substrates are arranged side by side in a substantially horizontal direction.

4. A substrate processing apparatus as recited in claim 3, wherein said second substrate transfer means is capable of receiving a plurality of said substrates which are arranged side by side in a substantially horizontal direction and held by said second substrate holding means, and is capable of substantially simultaneously mounting said plurality of substrates thereafter onto said first substrate holding means in a state where said plurality of substrates are stacked in a substantially vertical direction.

5. A substrate processing apparatus as recited in claim 1, wherein said second substrate transfer means is capable of mounting a plurality of said substrates one by one onto said second substrate holding means, and/or is capable of receiving a plurality of said substrates one by one from said second substrate holding means.

6. A substrate processing apparatus as recited in claim 1, wherein said second substrate transfer means is capable of simultaneously mounting a plurality of said substrates onto said second substrate holding means, and/or is capable of simultaneously receiving a plurality of said substrates from said second substrate holding means.

7. A substrate processing apparatus as recited in claim 1, wherein said second substrate transfer means is an articulated robot.

8. A substrate processing apparatus as recited in claim 7, wherein said articulated robot includes a plurality of joints and a plurality of arms, wherein a forefront arm of said plurality of arms is a substrate mounting arm capable of mounting said substrate or said substrates, and wherein said substrate mounting arm is capable of, in a state where said substrate mounting arm is extended toward said second substrate holding means, mounting said substrate or said substrates onto said second substrate holding means utilizing said substrate mounting arm and/or receiving said substrate or said substrates from said second substrate holding means utilizing said substrate mounting arm.

9. A substrate processing apparatus as recited in claim 8, wherein said substrate mounting arm includes a plurality of auxiliary substrate mounting arms mounted to a same joint, and wherein in a state where substrate mounting sections of said plurality of auxiliary mounting arms are stacked in a substantially vertical direction by closing said plurality of auxiliary substrate mounting arms, a plurality of said substrates stacked in a substantially vertical direction can substantially simultaneously be received by said plurality of said auxiliary substrate mounting arms from said first substrate holding means and/or a plurality of said substrates stacked in a substantially vertical direction can substantially simultaneously be mounted by said plurality of said auxiliary substrate mounting arms onto said first substrate holding means.

10. A substrate processing apparatus as recited in claim 8, wherein said substrate mounting arm includes a plurality of auxiliary substrate mounting arms mounted to a same joint, and wherein in a state where substrate mounting sections of said plurality of auxiliary mounting arms are opened in a substantially horizontal direction by opening said plurality of auxiliary mounting arms around said joint, a plurality of said substrates can substantially simultaneously be received from said second substrate holding means by said plurality of auxiliary substrate mounting arms and/or a plurality of said substrates can substantially simultaneously be mounted by said plurality of auxiliary substrate mounting arms onto said second substrate holding means in a state where said plurality of substrates are arranged side by side in a substantially horizontal direction.

11. A substrate processing apparatus as recited in claim 10, wherein said substrate mounting sections of said plurality of auxiliary substrate mounting arms can be opened in a substantially horizontal direction by first extending said substrate mounting arm toward said second substrate holding means, and then opening said plurality of auxiliary substrate mounting arms around said joint, and wherein in a state where said substrate mounting sections of said plurality of auxiliary substrate mounting arms are opened in a substantially horizontal direction by opening said plurality of auxiliary substrate mounting arms around said joint, said plurality of substrates can substantially simultaneously be received from said second substrate holding means utilizing said plurality of auxiliary substrate mounting arms and/or said plurality of substrates can substantially simultaneously be mounted on said second substrate holding means in a state where said plurality of substrates are arranged side by side in a substantially horizontal direction utilizing said plurality of auxiliary substrate mounting arms.

12. A substrate processing apparatus as recited in claim 10, wherein said substrate mounting sections of said plurality of auxiliary substrate mounting arms can be opened in a substantially horizontal direction by opening said plurality of auxiliary substrate mounting arms around said joint while extending said substrate mounting arm toward said second substrate holding means, and wherein in a state where said substrate mounting sections of said plurality of auxiliary substrate mounting arms are opened in a substantially horizontal direction by opening said plurality of auxiliary substrate mounting arms around said joint, said plurality of substrates can substantially simultaneously be received from said second substrate holding means utilizing said plurality of auxiliary substrate mounting arms and/or said plurality of substrates can substantially simultaneously be mounted on said second substrate holding means in a state where said plurality of substrates are arranged side by side in a substantially horizontal direction utilizing said plurality of auxiliary substrate mounting arms.

13. A substrate processing apparatus as recited in claim 9, wherein said plurality of auxiliary substrate mounting arms are opened and closed utilizing bevel gears.

14. A substrate processing apparatus as recited in claim 1, further including a substrate elevator means capable of moving said substrate up and down with respect to said second substrate holding means.

15. A substrate processing apparatus as recited in claim 14, wherein said second substrate holding means includes a plurality of substrate holding sections for holding a plurality of said substrates, respectively, and a degree of up and down movement by said substrate elevator means is variable depending upon each of said plurality of substrate holding sections.

16. A substrate processing apparatus as recited in claim 14, wherein said second substrate holding means is a susceptor, and said substrate elevator means are pins or pedestals capable of moving up and down with respect to said susceptor.

17. A substrate processing apparatus as recited in claim 1, wherein said substrate processing apparatus is a plasma processing apparatus for processing said substrate utilizing plasma.

18. A substrate processing apparatus as recited in claim 1, wherein said second substrate transfer means is capable of simultaneously transferring a same number of substrates as those to be processed at a time in said substrate processing chamber.

19. A substrate processing apparatus as recited in claim 1, wherein said first substrate holding means is capable of holding at least twice as many substrates as that or those processed at a time in said substrate processing chamber.

20. A substrate processing apparatus as recited in claim 1, wherein said first substrate holding means is capable of holding at least twice as many substrates as that or those which said second substrate holding means can hold.

21. A substrate processing apparatus as recited in claim 1, further comprising elevator means capable of moving said first substrate holding means up and down.

22. A substrate processing apparatus as recited in claim 1, wherein said first substrate holding means is a heat resistant substrate holding means.

23. A substrate processing apparatus as recited in claim 1, wherein said first substrate transfer means is capable of simultaneously transferring a plurality of said substrates.

24. A substrate processing apparatus as recited in claim 1, wherein said module comprises:

said substrate processing chamber, having a hermetic structure of vacuum level, for processing said substrate or said substrates;

said first and second intermediate chambers provided between said substrate processing chamber and said substrate transfer section, each of said first and second intermediate chambers having a hermetic structure of vacuum level, said first intermediate chamber being located closer to said substrate processing chamber than said second intermediate chamber, and said second intermediate chamber being located closer to said substrate transfer section than said first intermediate chamber;

said first valve provided between said substrate processing chamber and said first intermediate chamber, said first valve being capable of establishing hermetic isolation of vacuum level between said substrate processing chamber and said first intermediate chamber when said first valve is closed and being capable of allowing said substrate or said substrates to pass through said first valve when said first valve is opened;

said second valve provided between said first and second intermediate chambers, said second valve being capable of establishing hermetic isolation of vacuum level between said first and second intermediate chambers when said second valve is closed and being capable of allowing said substrate or said substrates to pass through said second valve when said second valve is opened; and said third valve provided between said second intermediate chamber and said substrate transfer section, said third valve being capable of establishing hermetic isolation of vacuum level between said second intermediate chamber and said substrate transfer section when said third valve is closed and being capable of allowing said substrate or said substrates to pass through said third valve when said third valve is opened.

25. A substrate processing apparatus as recited in claim 1, wherein said substrate transfer section transfers said substrate or said substrates under atmospheric pressure.

26. A substrate processing apparatus as recited in claim 25, wherein said substrate processing chamber is a substrate processing chamber wherein said substrate is or said substrates are processed under a reduced pressure.

27. A substrate processing apparatus, comprising:
a substrate transfer section;
a plurality of modules attached to said substrate transfer section; and
first substrate transfer means disposed in said substrate transfer section and capable of transferring a substrate or substrates to said plurality of module,
wherein each of said plurality of modules includes a substrate processing chamber, having a hermetic structure, for processing said substrate or said substrates;
a first and second intermediate chambers provided between said substrate processing chamber and said substrate transfer section, each of said first and second intermediate chambers having a hermetic structure, said first intermediate chamber being located closer to said substrate processing chamber than said second intermediate chamber, and said second intermediate chamber being located closer to said substrate transfer section than said first intermediate chamber;
a first valve provided between said substrate processing chamber and said first intermediate chamber, said first valve being capable of establishing hermetic isolation between said substrate processing chamber and said first intermediate chamber when said first valve is closed and being capable of allowing said substrate or said substrates to pass through said first valve when said first valve is opened;
a second valve provided between said first and second intermediate chambers, said second valve being capable of establishing hermetic isolation between said first and second intermediate chambers when said second valve is closed and being capable of allowing said substrate or said substrates to pass through said second valve when said second valve is opened; and
a third valve provided between said second intermediate chamber and said substrate transfer section, said third valve being capable of establishing hermetic isolation between said second intermediate chamber and said substrate transfer section when said third valve is closed and being capable of allowing said substrate or said substrates to pass through said third valve when said third valve is opened, wherein said second intermediate chamber is provided with first substrate holding means capable of holding a plurality of said substrates such that said plurality of substrates are stacked in a substantially vertical direction, wherein said substrate processing chamber is provided with second substrate holding means capable of holding a plurality of said substrates such that said plurality of substrates are arranged side by side in a substantially horizontal direction, and wherein said first intermediate chamber is provided with second substrate transfer means capable of mounting said plurality of substrates held in a substantially vertical direction by said first substrate holding means, onto said second substrate holding means such that said plurality of substrates are arranged side by side in a substantially horizontal direction.

28. A substrate processing apparatus as recited in claim 27, wherein said second substrate transfer means is capable of mounting said plurality of substrates held by said second substrate holding means such that said substrates are arranged side by side in a substantially horizontal direction onto said first substrate holding means such that said plurality of substrates are stacked in a substantially vertical direction.

29. A substrate processing apparatus as recited in claim 27, wherein said second substrate transfer means is capable of substantially simultaneously receiving a plurality of said substrates from said first substrate holding means in a state where said substrates are stacked in a substantially vertical direction, and is capable of mounting said plurality of substrates on said second substrate holding means in a state where said plurality of substrates are arranged side by side in a substantially horizontal direction.

30. A substrate processing apparatus as recited in claim 29, wherein said second substrate transfer means is capable of receiving a plurality of said substrates which are arranged side by side in a substantially horizontal direction and held by said second substrate holding means, and is capable of substantially simultaneously mounting said plurality of substrates onto said first substrate holding means in a state where said plurality of substrates are stacked in a substantially vertical direction.

31. A substrate processing apparatus as recited in claim 27, wherein said second substrate transfer means is capable of mounting a plurality of said substrates one by one onto said second substrate holding means, and/or is capable of receiving a plurality of said substrates one by one from said second substrate holding means.

32. A substrate processing apparatus as recited in claim 27, wherein said second substrate transfer means is capable of simultaneously mounting a plurality of said substrates onto said second substrate holding means, and/or is capable of simultaneously receiving a plurality of said substrates from said second substrate holding means.

33. A substrate processing apparatus as recited in claim 27, wherein said second substrate transfer means is an articulated robot.

34. A substrate processing apparatus as recited in claim 33, wherein said articulated robot includes a plurality of joints and a plurality of arms,
wherein a forefront arm of said plurality of arms is a substrate mounting arm capable of mounting said substrate or said substrates, and
wherein said substrate mounting arm is capable of, in a state where said substrate mounting arm is extended toward said second substrate holding means, mounting said substrate or said substrates onto said second substrate holding means utilizing said substrate mounting arm and/or receiving said substrate or said substrates from said second substrate holding means utilizing said substrate mounting arm.

35. A substrate processing apparatus as recited in claim 34, wherein said substrate mounting arm includes a plurality of auxiliary substrate mounting arms mounted to a same joint, and wherein in a state where substrate mounting sections of said plurality of auxiliary mounting arms are stacked in a substantially vertical direction by closing said plurality of auxiliary substrate mounting arms, a plurality of said substrates stacked in a substantially vertical direction can substantially simultaneously be received by said plurality of said auxiliary substrate mounting arms from said first substrate holding means and/or a plurality of said substrates stacked in a substantially vertical direction can substantially simultaneously be mounted by said plurality of said auxiliary substrate mounting arms onto said first substrate holding means.

36. A substrate processing apparatus as recited in claim 34, wherein said substrate mounting arm includes a plurality of auxiliary substrate mounting arms mounted to a same joint, and wherein in a state where substrate mounting sections of said plurality of auxiliary mounting arms are opened in a substantially horizontal direction by opening said plurality of auxiliary mounting arms around said joint, a plurality of said substrates can substantially simultaneously be received from said second substrate holding means by said plurality of auxiliary substrate mounting arms and/or a plurality of said substrates can substantially simultaneously be mounted by said plurality of auxiliary substrate mounting arms onto said second substrate holding means in a state where said plurality of substrates are arranged side by side in a substantially horizontal direction.

37. A substrate processing apparatus as recited in claim 36, wherein said substrate mounting sections of said plurality of auxiliary substrate mounting arms can be opened in a substantially horizontal direction by first extending said substrate mounting arm toward said second substrate holding means, and then opening said plurality of auxiliary substrate mounting arms around said joint, and wherein in a state where said substrate mounting sections of said plurality of auxiliary substrate mounting arms are opened in a substantially horizontal direction by opening said plurality of auxiliary substrate mounting arms around said joint, said plurality of substrates can substantially simultaneously be received from said second substrate holding means utilizing said plurality of auxiliary substrate mounting arms and/or said plurality of substrates can substantially simultaneously be mounted on said second substrate holding means in a state where said plurality of substrates are arranged side by side in a substantially horizontal direction utilizing said plurality of auxiliary substrate mounting arms.

38. A substrate processing apparatus as recited in claim 36, wherein said substrate mounting sections of said plurality of auxiliary substrate mounting arms can be opened in a substantially horizontal direction by opening said plurality of auxiliary substrate mounting arms around said joint while extending said substrate mounting arm toward said second substrate holding means, and wherein in a state where said substrate mounting sections of said plurality of auxiliary substrate mounting arms are opened in a substantially horizontal direction by opening said plurality of auxiliary substrate mounting arms around said joint, said plurality of substrates can substantially simultaneously be received from said second substrate holding means utilizing said plurality of auxiliary substrate mounting arms and/or said plurality of substrates can substantially simultaneously be mounted on said second substrate holding means in a state where said plurality of substrates are arranged side by side in a substantially horizontal direction utilizing said plurality of auxiliary substrate mounting arms.

39. A substrate processing apparatus as recited in claim 35, wherein said plurality of auxiliary substrate mounting arms are opened and closed utilizing bevel gears.

40. A substrate processing apparatus as recited in claim 27, further comprising substrate elevating means capable of moving said substrate up and down with respect to said second substrate holding means.

41. A substrate processing apparatus as recited in claim 40, wherein said second substrate holding means includes a plurality of substrate holding sections for holding a plurality of said substrates, respectively, and a degree of up and down movement by said substrate elevator means is variable depending upon each of said plurality of substrate holding sections.

42. A substrate processing apparatus as recited in claim 40, wherein said second substrate holding means is a susceptor, and said substrate elevator means are pins or pedestals capable of moving up and down with respect to said susceptor.

43. A substrate processing apparatus as recited in claim 27, wherein said substrate processing apparatus is a plasma processing apparatus for processing said substrate utilizing plasma.

44. A substrate processing apparatus as recited in claim 27, wherein said second substrate transfer means is capable of simultaneously transferring the same number of substrates as those to be processed at a time in said substrate processing chamber.

45. A substrate processing apparatus as recited in claim 27, wherein said first substrate holding means is capable of holding at least twice as many substrates as that or those processed at a time in said substrate processing chamber.

46. A substrate processing apparatus as recited in claim 27, wherein said first substrate holding means is capable of holding at least twice as many substrates as that or those which said second substrate holding means can hold.

47. A substrate processing apparatus as recited in claim 27, further comprising an elevator means capable of moving said first substrate holding means up and down.

48. A substrate processing apparatus as recited in claim 27, wherein said first substrate holding means is a heat resistant substrate holding means.

49. A substrate processing apparatus as recited in claim 27, wherein said first substrate transfer means is capable of simultaneously transferring a plurality of said substrates.

50. A substrate processing apparatus as recited in claim 27, wherein each of said plurality of modules comprises:

said substrate processing chamber, having a hermetic structure of vacuum level, for processing said substrate or said substrates;

said first and second intermediate chambers provided between said substrate processing chamber and said substrate transfer section, each of said first and second intermediate chambers having a hermetic structure of vacuum level, said first intermediate chamber being located closer to said substrate processing chamber than said second intermediate chamber, and said second intermediate chamber being located closer to said substrate transfer section than said first intermediate chamber;

said first valve provided between said substrate processing chamber and said first intermediate chamber, said first valve being capable of establishing hermetic isolation of vacuum level between said substrate processing chamber and said first intermediate chamber when said first valve is closed and being capable of allowing said substrate or said substrates to pass through said first valve when said first valve is opened;

said second valve provided between said first and second intermediate chambers, said second valve being capable of establishing hermetic isolation of vacuum level between said first and second intermediate chambers when said second valve is closed and being capable of allowing said substrate or said substrates to pass through said second valve when said second valve is opened; and said third valve provided between said second intermediate chamber and said substrate transfer section, said third valve being capable of establishing hermetic isolation of vacuum level between said second intermediate chamber and said substrate transfer section when said third valve is closed and being capable of allowing said substrate or said substrates to pass through said third valve when said third valve is opened.

51. A substrate processing apparatus as recited in claim 27, wherein said substrate transfer section transfers said substrate or said substrates under atmospheric pressure.

52. A substrate processing apparatus as recited in claim 51, wherein said substrate processing chamber is a substrate processing chamber wherein said substrate is or said substrates are processed under a reduced pressure.

53. A substrate processing apparatus as recited in claim 27, wherein said plurality of second modules are piled in a substantially vertical direction and separated from one another, and each of said plurality of second modules is detachably attached to said substrate transfer section.

54. A substrate transfer device capable of transferring a plurality of substrates between a first substrate holding means capable of holding a plurality of said substrates such that said plurality of substrates are stacked in a substantially vertical direction and a second substrate holding means capable of holding a plurality of said substrates such that said plurality of substrates are arranged side by side in a substantially horizontal direction, comprising:

said substrate transfer device includes a plurality of substrate mounting means capable of mounting said substrates, each of said plurality of substrate mounting means includes a substrate mounting section for mounting said substrate, in a state where said substrate mounting sections are stacked in a substantially vertical direction, a plurality of substrates stacked in a substantially vertical direction can substantially simultaneously be received from said first substrate holding means by said plurality of substrate mounting means and/or a plurality of said substrates can substantially simultaneously be mounted on said first substrate holding means by said plurality of substrate mounting means such that said plurality of substrates are stacked in a substantially vertical direction; and in a state where said substrate mounting sections are arranged side by side in a substantially horizontal direction, a plurality of said substrates can substantially simultaneously be received from said second substrate holding means by said plurality of substrate mounting means and/or a plurality of said substrates can substantially simultaneously be mounted on said second substrate holding means in a state where said plurality of substrates are arranged side by side in a substantially horizontal direction by said plurality of substrate mounting means.

55. A substrate transfer device as recited in claim 54, wherein said plurality of substrate mounting means are capable of opening and closing with respect to each other around a single rotation center in a substantially horizontal direction, in a state where said substrate mounting sections are stacked in a substantially vertical direction by closing said plurality of substrate mounting means, a plurality of said substrates stacked in a substantially vertical direction can substantially simultaneously be received from said first substrate holding means by said plurality of substrate mounting means and/or a plurality of said substrates can substantially simultaneously be mounted on said first substrate holding means by said plurality of substrate mounting means such that said plurality of substrates are stacked in a substantially vertical direction, and in a state where said substrate mounting sections are arranged side by side in a substantially horizontal direction by opening said plurality of substrate mounting means with respect to each other around said rotation center in a substantially horizontal direction, a plurality of said substrates can substantially simultaneously be received from said second substrate holding means by said plurality of substrate mounting means and/or a plurality of said substrates can substantially simultaneously be mounted on said second substrate holding means in a state where said plurality of substrates are arranged in a substantially horizontal direction by said plurality of substrate mounting means.

56. A substrate transfer device as recited in claim 55, wherein said plurality of substrate mounting means are opened and closed utilizing bevel gears.

57. A substrate transfer device as recited in claim 54, wherein said substrate transfer device is an articulated robot.

58. A substrate transfer apparatus, comprising:

a first substrate holding means capable of holding a plurality of substrates such that said plurality of substrates are stacked in a substantially vertical direction;

a second substrate holding means capable of holding a plurality of substrates such that said plurality of substrates are arranged side by side in a substantially horizontal direction; and a substrate transfer device as recited in claim 54 and capable of transferring said substrates between said first substrate holding means and said second substrate holding means.

59. A substrate transfer apparatus as recited in claim 58, further comprising a substrate elevating means capable of moving said substrate up and down with respect to said second substrate holding means.

60. A substrate transfer apparatus as recited in claim 59, wherein said second substrate holding means includes a plurality of substrate holding sections for respectively holding each of said plurality of substrates, and a degree of up and down movement by said substrate elevating means is variable depending upon each of said plurality of substrate holding sections.

61. A substrate transfer apparatus as recited in claim 59, wherein said second substrate holding means is a susceptor, and said substrate elevating means are pins or pedestals capable of moving up and down with respect to said susceptor.

62. A substrate transfer apparatus as recited in claim 58, further comprising an elevating means capable of moving said first substrate holding means up and down.

63. A substrate transfer apparatus as recited in claim 58, further comprising:
   a first chamber for accommodating said second substrate holding means;
   a second chamber for accommodating said substrate transfer device; and
   a valve provided between said first and second chambers, said valve being capable of establishing hermetic isolation between said first and second chambers when said valve is closed, and is capable of allowing said substrate or said substrates to pass through said valve,
   wherein said substrate transfer device is an articulated robot,
   said articulated robot includes a plurality of joints and a plurality of arms,
   the forefront arm of said plurality of arms is a substrate mounting arm capable of mounting said substrate or said substrates,
   said substrate mounting arm comprises said plurality of substrate mounting means,
   said substrate mounting arm is capable of, in a state where said substrate mounting arm is extended toward said second substrate holding means, mounting said substrate or said substrates onto said second substrate holding means utilizing said substrate mounting means and/or receiving said substrate or said substrates from said second substrate holding means utilizing said substrate mounting means.

64. A substrate transfer apparatus as recited in claim 63, wherein said substrate mounting arm can be first extended toward said second substrate holding means, and then said substrate mounting sections of said plurality of substrate mounting means are capable of opening in a substantially horizontal direction, and wherein in a state where said substrate mounting sections of said plurality of substrate mounting means are arranged side by side in a substantially horizontal direction, a plurality of said substrates can substantially simultaneously be received from said second substrate holding means utilizing said substrate mounting means and/or a plurality of said substrates can substantially simultaneously be mounted on said second substrate holding means in a state where said plurality of substrates are arranged side by side in a substantially horizontal direction utilizing said plurality of substrate mounting means.

65. A substrate transfer apparatus as recited in claim 63, wherein said substrate mounting sections of said plurality of substrate mounting means are capable of opening in a substantially horizontal direction while said substrate mounting arm is extended toward said second substrate holding means, and wherein in a state where said substrate mounting sections of said plurality of substrate mounting means are arranged side by side in a substantially horizontal direction, a plurality of said substrates can substantially simultaneously be received from said second substrate holding means utilizing said plurality of substrate mounting means and/or a plurality of said substrates can substantially simultaneously be mounted on said second substrate holding means in a state where said plurality of substrates are arranged side by side in a substantially horizontal direction utilizing said plurality of substrate mounting means.

66. A substrate transfer apparatus as recited in claim 58, wherein said substrate transfer apparatus is a substrate processing apparatus.

67. A substrate transfer apparatus as recited in claim 66, wherein said substrate processing apparatus is a plasma processing apparatus for processing said substrate or said substrates utilizing plasma.

* * * * *